(12) United States Patent
Matsuda et al.

(10) Patent No.: US 8,911,108 B2
(45) Date of Patent: Dec. 16, 2014

(54) LIGHT BULB SHAPED LAMP AND LIGHTING APPARATUS

(75) Inventors: Tsugihiro Matsuda, Kyoto (JP); Nobuyoshi Takeuchi, Osaka (JP); Hideo Nagai, Osaka (JP); Masahiro Miki, Osaka (JP); Takaari Uemoto, Osaka (JP)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 13/818,440

(22) PCT Filed: Oct. 14, 2011

(86) PCT No.: PCT/JP2011/005754
§ 371 (c)(1),
(2), (4) Date: Feb. 22, 2013

(87) PCT Pub. No.: WO2012/060058
PCT Pub. Date: May 10, 2012

(65) Prior Publication Data
US 2013/0155683 A1  Jun. 20, 2013

(30) Foreign Application Priority Data

Nov. 4, 2010 (JP) ................................. 2010-247917
Nov. 4, 2010 (JP) ................................. 2010-247935

(51) Int. Cl.
| | |
|---|---|
| F21S 4/00 | (2006.01) |
| F21V 15/01 | (2006.01) |
| F21K 99/00 | (2010.01) |
| F21V 25/02 | (2006.01) |
| F21V 3/00 | (2006.01) |
| F21Y 101/02 | (2006.01) |
| F21Y 103/00 | (2006.01) |
| F21Y 105/00 | (2006.01) |
| H01L 25/075 | (2006.01) |

(52) U.S. Cl.
CPC ................. *F21V 15/01* (2013.01); *F21K 9/135* (2013.01); *F21V 25/02* (2013.01); *F21V 3/00* (2013.01); *F21Y 2101/02* (2013.01); *F21Y 2103/003* (2013.01); *F21Y 2105/001* (2013.01); *H01L 25/0753* (2013.01); *H01L 2224/45144* (2013.01); *H01L 2224/48137* (2013.01); *H01L 2224/48463* (2013.01); *H01L 2224/49107* (2013.01); *H01L 2224/73265* (2013.01)
USPC .................................. 362/249.02; 362/249.01

(58) Field of Classification Search
CPC .................................................. F21Y 2101/02
USPC .................................. 362/84, 249.01, 249.02
See application file for complete search history.

(56) References Cited

U.S. PATENT DOCUMENTS

| | | | |
|---|---|---|---|
| 4,211,955 A | 7/1980 | Ray | |
| 5,749,646 A * | 5/1998 | Brittell | 362/231 |

(Continued)

FOREIGN PATENT DOCUMENTS

| | | |
|---|---|---|
| CN | 1349065 | 5/2002 |
| CN | 1655318 | 8/2005 |

(Continued)

OTHER PUBLICATIONS

International Search Report, mail date is Jan. 17, 2012.

(Continued)

*Primary Examiner* — Vip Patel
(74) *Attorney, Agent, or Firm* — Greenblum & Bernstein, P.L.C.

(57) ABSTRACT

A light bulb shaped lamp includes: a hollow globe having an opening; an LED module having a base platform and an LED chip mounted on the base platform, the LED module being housed in the globe; a stem extending from the opening of the globe to the vicinity of the LED module; and a regulating component which regulates movement of the LED module with respect to the stem.

19 Claims, 30 Drawing Sheets

(56) References Cited

U.S. PATENT DOCUMENTS

| | | |
|---|---|---|
| 6,778,400 B2 | 8/2004 | Kurle et al. |
| 7,388,324 B2 | 6/2008 | Foo |
| 7,758,223 B2 | 7/2010 | Osawa et al. |
| 8,207,541 B2 | 6/2012 | Van Herpen et al. |
| 8,226,266 B2 | 7/2012 | Chiang |
| 2002/0149916 A1 | 10/2002 | Kurle et al. |
| 2005/0200285 A1 | 9/2005 | Foo |
| 2006/0227558 A1 | 10/2006 | Osawa et al. |
| 2010/0096647 A1 | 4/2010 | Van Herpen et al. |
| 2010/0110675 A1 | 5/2010 | Van Herpen et al. |
| 2010/0237761 A1 | 9/2010 | Osawa et al. |
| 2010/0237779 A1 | 9/2010 | Osawa et al. |
| 2010/0244650 A1 | 9/2010 | Osawa et al. |
| 2010/0244694 A1 | 9/2010 | Osawa et al. |
| 2010/0244695 A1 | 9/2010 | Van Herpen et al. |
| 2010/0253200 A1 | 10/2010 | Osawa et al. |
| 2010/0253221 A1 | 10/2010 | Chiang |
| 2011/0156569 A1 | 6/2011 | Osawa |
| 2011/0309386 A1 | 12/2011 | Osawa et al. |
| 2011/0310606 A1 | 12/2011 | Osawa et al. |
| 2012/0294005 A1 | 11/2012 | Osawa et al. |
| 2012/0294006 A1 | 11/2012 | Osawa et al. |
| 2012/0300458 A1 | 11/2012 | Osawa et al. |
| 2012/0300477 A1 | 11/2012 | Osawa et al. |

FOREIGN PATENT DOCUMENTS

| | | |
|---|---|---|
| CN | 201007995 | 1/2008 |
| CN | 101509616 | 8/2009 |
| CN | 101858495 | 10/2010 |
| JP | 49-109403 | 9/1974 |
| JP | 2-140887 | 11/1990 |
| JP | 3075689 | 12/2000 |
| JP | 2001-126510 | 5/2001 |
| JP | 2003-533056 | 11/2003 |
| JP | 2005-243407 | 9/2005 |
| JP | 2006-313717 | 11/2006 |
| JP | 2010-157459 | 7/2010 |
| JP | 2010-525504 | 7/2010 |
| JP | 2010-245037 | 10/2010 |
| WO | 01/87029 | 11/2001 |
| WO | 2008/120170 | 3/2008 |
| WO | 2010/096498 | 8/2010 |

OTHER PUBLICATIONS

Japan Office action, mail date is Dec. 3, 2013.
China Office action with search report, dated Jul. 22, 2014 along with an english translation of search report.

* cited by examiner

FIG. 7
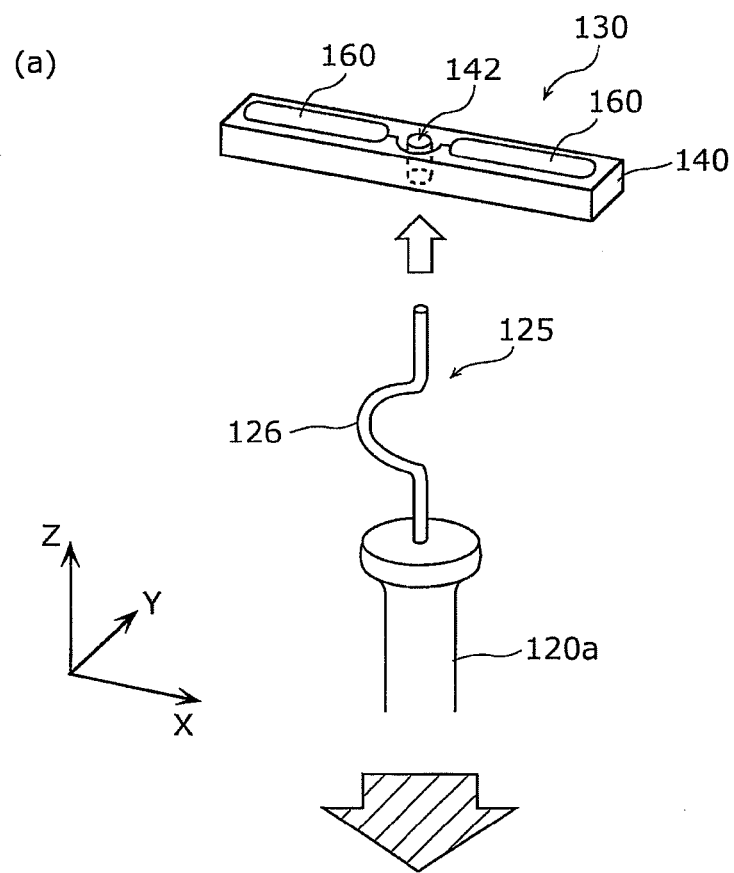
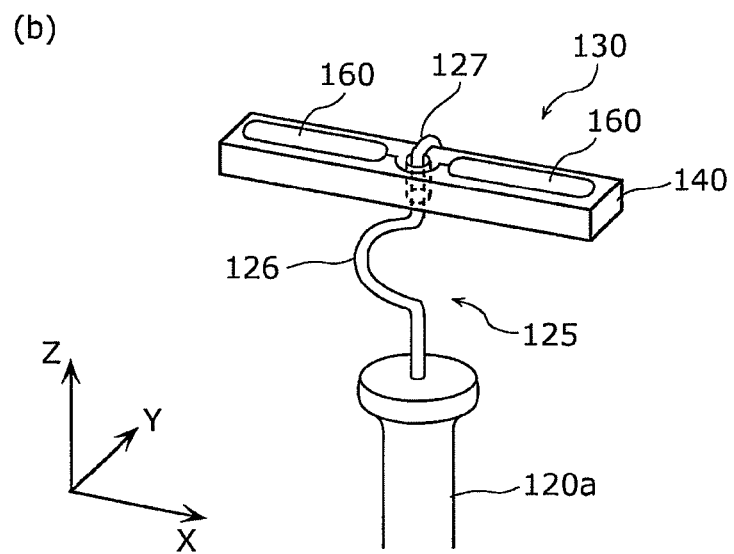

LIGHT BULB SHAPED LAMP AND LIGHTING APPARATUS

TECHNICAL FIELD

The present invention relates to a light bulb shaped lamp having a semiconductor light-emitting element and a lighting apparatus which includes the light bulb shaped lamp.

BACKGROUND ART

Light emitting diodes (LED) which are semiconductor light-emitting elements are smaller, have higher efficiency and longer product life than the conventional illumination light sources. Recent market needs for saving energy and resource boost the demand for light bulb shaped lamps using LEDs (hereafter simply referred to as "LED light bulb") and lighting apparatuses including the LED light bulbs, replacing conventional incandescent light bulbs using filament coils.

Known properties of LEDs include reduced light output as temperature increases, which lead to shorter product life. In response to this problem, a metal case is provided between semispherical globe and a base in a conventional LED light bulb so as to suppress the increase in the temperature of LED (for example, see Patent Literature 1). The metal case functions as a heat sink for radiating heat generated in LED to outside, making it possible to suppress the increase in the temperature of LED and to prevent the reduction in light output.

CITATION LIST

Patent Literature

[Patent Literature 1] Japanese Unexamined Patent Application Publication No. 2006-313717

SUMMARY OF INVENTION

Technical Problem

However, with the conventional LED light bulb, the LED is provided on the surface of the metal case in the globe, and thus the radiation of light toward the base is blocked by the case, and the light diffuses differently from the light emitted by the incandescent light bulb. Stated differently, it is difficult for the conventional LED light bulb to achieve light distribution characteristic equivalent or similar to that of incandescent light bulb.

One possible solution is to change the configuration of the LED light bulbs to a configuration same as the incandescent light bulbs. More specifically, in one possible configuration of such an LED light bulb, a filament coil installed between two lead wires of the incandescent light bulb is replaced with a light-emitting module (LED module) having an LED and a base platform on which the LED is mounted. In this configuration, the LED module is suspended in the globe. Accordingly, the light generated by the LED is not blocked by the case, allowing the LED light bulb to achieve a light distribution property equivalent or similar to that of incandescent light bulb.

However, the LED module is heavier than the filament coil used for the incandescent light bulb. Accordingly, there is a possibility that the stress is exerted on the part connecting the lead wire and the LED module by the vibration and others at the time of transportation, and the lead wires are disconnected from the LED module.

The present invention has been conceived in order to solve the problem, and it is an object of the present invention to provide a light bulb shaped lamp capable of achieving the light distribution property equivalent or similar to that of the conventional incandescent light bulb and reducing the possibility that the lead wire is disconnected from the light-emitting module, and a lighting apparatus having the light bulb shaped lamp.

Solution to Problem

In order to achieve the object described above, the light bulb shaped lamp according to an aspect of the present invention includes: a hollow globe having an opening; a first light-emitting module having a first base platform and a first semiconductor light-emitting device mounted on the first base platform, the first light-emitting module being housed in the globe; a stem extending from the opening of the globe to the vicinity of the first light-emitting module; and a regulating component which is fixed to an end of the stem and which regulates movement of the first light-emitting module with respect to the stem.

According to this configuration, the regulating component fixed to the end of the stem can regulate the movement of the first light-emitting module with respect to the stem. Accordingly, when the light bulb shaped lamp is shaken, for example, it is possible to suppress the stress exerted on the part connecting the lead wire and the first light-emitting module, and to reduce the possibility that the lead wire is disconnected from the first light-emitting module. Furthermore, since the regulating component is fixed to the end of the stem extending to the vicinity of the first light-emitting module. Accordingly, it is possible to shorten the length of the regulating component. Accordingly, it is possible to regulate the movement of the light-emitting module further, and further reduce the possibility that the lead wires are disconnected from the light-emitting module by vibration or others. Furthermore, the light generated by the semiconductor light-emitting device is not blocked by the base platform, allowing the light bulb shaped lamp to achieve the light distribution property equivalent or similar to that of conventional incandescent light bulb.

The first base platform may have a through hole, and the regulating component may be inserted in the through hole.

With this structure, since the regulating component is inserted into the through hole in the first base platform, it is possible to regulate the movement of the light-emitting module further, and further reduce the possibility that the lead wires are disconnected from the light-emitting module by vibration or others.

The regulating component may have a supporting part which supports the first base platform from a side closer to the stem.

With this structure, the movement of the first light-emitting module toward the stem is regulated by the supporting part. Accordingly, it is possible to further reduce the possibility that the lead wire is disconnected from the first light-emitting module by vibration or others.

The regulating component may be a linear component, and the supporting part may be a bent part of the regulating component, and be formed between the end of the stem and the first base platform.

With this structure, the supporting part is defined by the bent part of the regulating component. Accordingly, it is possible to regulate the movement of the light-emitting module toward the stem with a simple structure.

The bent part may be U-shaped.

With this structure, the supporting part is defined by the part of the regulating component bent in U-shape. Accordingly, it is possible to regulate the movement of the light-emitting module toward the stem with a simple structure.

The supporting part may have a width larger than the width of the through hole, and be provided between the end of the stem and the first base platform.

With this structure, the supporting part is composed of a component having a width larger than the width of the through hole. Accordingly, it is possible to regulate the movement of the first light-emitting module toward the stem.

The light bulb shaped lamp may include a plurality of the regulating components, in which the first base platform has a plurality of the through-holes each corresponding to one of the regulating components, and axial directions of at least two of the through holes are different from each other.

With this structure, the axial directions of the two through holes are different from each other. Accordingly, even if a force is exerted on the axial direction of one of the through holes, the regulating component inserted into the other through hole can regulate the movement of the first base platform toward the direction of the force. Accordingly, it is possible to further reduce the possibility that the lead wires are disconnected from the light-emitting module by vibration or others.

The stem may be bonded to the globe so as to close the opening of the globe, and a part of the regulating component may be sealed to the stem.

With this structure, the opening of the globe is closed by the stem. Accordingly, it is possible to prevent the moisture from entering the globe from outside of the globe, and to suppress the degradation of the first semiconductor light-emitting device and the degradation of the part connecting the first light-emitting module and the regulating component (lead wire) by moisture. Accordingly, it is possible to further reduce the possibility that the lead wires are disconnected from the first light-emitting module by vibration or others.

An end portion of the regulating component projecting from the through hole may be bent.

With this structure, the end portion of the regulating component projecting from the through hole is bent, which allows regulation of the movement of the first base platform toward a direction away from the stem. Accordingly, it is possible to further reduce the possibility that the lead wires are disconnected from the first base platform by vibration or others.

An end portion of the regulating component inserted in the through hole may be fixed to the first base platform by a joining material.

With this structure, the end portion of the regulating component projecting from the through hole is fixed to the first base platform by the joining material. Accordingly, it is possible to further reduce the possibility that the lead wire is disconnected from the first base platform due to vibration or others.

The regulating component may support the first light-emitting module, and may be a first lead wire for supplying the first light-emitting module with power.

With this configuration, the regulating component functions as the first lead wire, which simplifies the configuration of the light bulb shaped lamp. Furthermore, the first light-emitting module can be supported by the first lead wire fixed to the end of the stem extending to the vicinity of the first light-emitting module. Stated differently, it is possible to make the part of the first lead wire exposed from the stem relatively short, increasing the strength of the first lead wire. Accordingly, when the light bulb shaped lamp is shaken, for example, it is possible to reduce the possibility that the first lead wire is disconnected from the first light-emitting module by vibration or others.

The light bulb shaped lamp may include a supporting wire fixed to the stem and supporting a peripheral portion of the first base platform.

With this structure, the peripheral portion of the first base platform is supported by the supporting wire. Accordingly, it is possible to further reduce the possibility that the first lead wire is disconnected from the first light-emitting module by vibration or others.

The stem may be bonded to the globe so as to close the opening of the globe, and a part of a first lead wire may be sealed in the stem.

With this structure, the opening of the globe is closed by the stem. Accordingly, it is possible to prevent the moisture from entering the globe from outside of the globe, and to suppress the degradation of the semiconductor light-emitting device and the degradation of the part connecting the first light-emitting module and the first lead wire by moisture. Accordingly, it is possible to further reduce the possibility that the first lead wires are disconnected from the first light-emitting module by vibration or others.

The light bulb shaped lamp may further include a second light-emitting module having a second base platform and a second semiconductor light-emitting device mounted on the second base platform, the second light-emitting module being housed in the globe; and at least two second lead wires supporting the first light-emitting module and the second light-emitting module, the at least two second lead wires being for supplying the first light-emitting module and the second light-emitting module with power, in which the first lead wire supports the first base platform and the second base platform, and one of the two second lead wires supports the first base platform and the other of the two second lead wires supports the second base platform.

With this structure, the first lead wire can achieve both the power supply to two light-emitting modules and the support of the two light-emitting modules. Accordingly, when the light bulb shaped lamp includes two light-emitting modules, it is possible to reduce the possibility that the lead wire is disconnected from the two light-emitting modules by a relatively simple structure.

In the globe, the first lead wire may electrically connect the first light-emitting module and the second light-emitting module.

With this structure, the first lead wire can achieve both the power supply to two light-emitting modules and the support of the two light-emitting modules in the globe. Accordingly, when the light bulb shaped lamp includes two light-emitting modules, it is possible to reduce the possibility that the lead wire is disconnected from the two light-emitting modules by a relatively simple structure.

The light bulb shaped lamp may include at least two of the first lead wires, in which one of the two first lead wires supports the first base platform, and the other of the two first lead wires supports the second base platform, the first light-emitting module is supplied with power through the one of the two first lead wires and the one of the two second lead wires, and the second light-emitting module is supplied with power through the other of the two first lead wires and the other of the two second lead wires.

With this configuration, power can be supplied to the two light-emitting modules through different lead wires. Accordingly, it is possible to turn only one of the two light-emitting modules.

The stem may be bonded to the globe so as to close the opening of the globe, and a part of each of the two first lead wires and a part of each of the two second lead wires may be sealed to the stem.

With this structure, the opening of the globe is closed by the stem. Accordingly, it is possible to prevent the moisture from entering the globe from outside of the globe, and to suppress the degradation of the semiconductor light-emitting device and the degradation of the part connecting the light-emitting module and the lead wire by moisture. Accordingly, it is possible to further reduce the possibility that the first lead wire and the second lead wire are disconnected from the first light-emitting module or the second light-emitting module by vibration or others.

The first base platform may be translucent.

With this structure, since the base platform is translucent, the base platform transmits the light emitted by the semiconductor light-emitting device. Stated differently, the light is emitted from a part of the base platform where no semiconductor light-emitting device is mounted. Accordingly, even when the semiconductor light-emitting device is mounted only on one side of the base platform, the light is emitted form the other surface, allowing the light bulb shaped lamp to achieve the light distribution property equivalent or similar to that of incandescent light bulb.

The stem may be transparent to visible light.

With this structure, the stem is transparent to the visible light, and it is possible to suppress the loss of light emitted by the semiconductor light-emitting device. Furthermore, the shadow cast by the stem can be prevented as well. In addition, the stem shines through the light emitted by the semiconductor light-emitting device, and thus visually superior appearance can be achieved.

The globe may be composed of glass transparent to visible light.

With this structure, the globe is transparent to the visible light, and it is possible to suppress the loss of light generated by the semiconductor light-emitting device. Furthermore, since the globe is made of glass, the globe is highly resistance to heat.

Furthermore, the present invention can be implemented not only as the light bulb shaped lamp described above but also as a lighting apparatus including the light bulb shaped lamp.

Advantageous Effects of Invention

The present invention can achieve the light distribution property equivalent or similar to that of incandescent light bulb, and is capable of reducing the possibility that the lead wire is disconnected from the light-emitting module.

BRIEF DESCRIPTION OF DRAWINGS

FIGS. 7(a) and (b) are perspective views of components around an LED module according to the variation 1 of the embodiment 1 of the present invention.

DESCRIPTION OF EMBODIMENTS

The following shall describe a light bulb shaped lamp and a lighting apparatus according to the embodiments of the present invention with reference to the drawings. Note that, the diagrams are schematic diagrams, and illustration is not necessarily strictly accurate.

Embodiment 1

First, a light bulb shaped lamp 100 according to the embodiment 1 of the present invention shall be described.

(Overall Configuration of Light Bulb Shaped Lamp 100)

Figure 1:
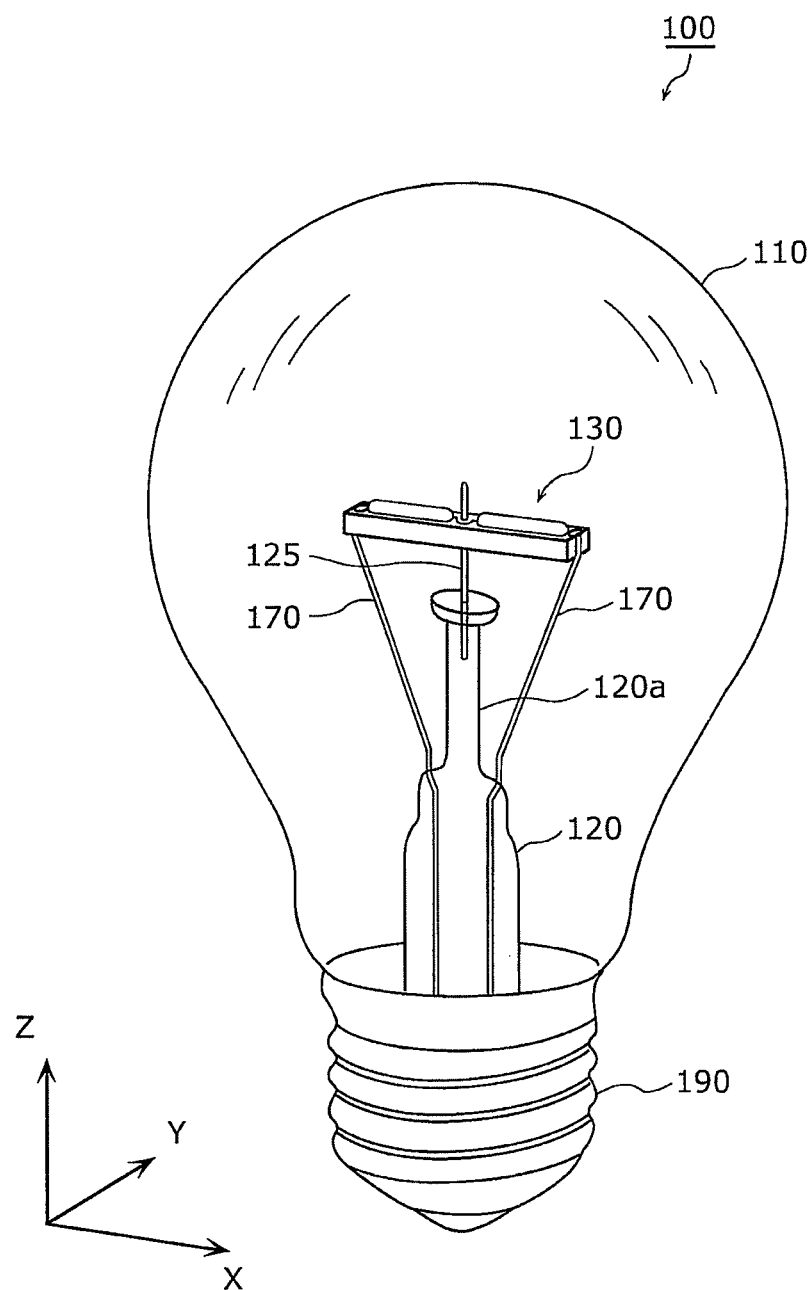
FIG. 1 is a perspective view of a light bulb shaped lamp according to the embodiment 1 of the present invention.
Figure 2:
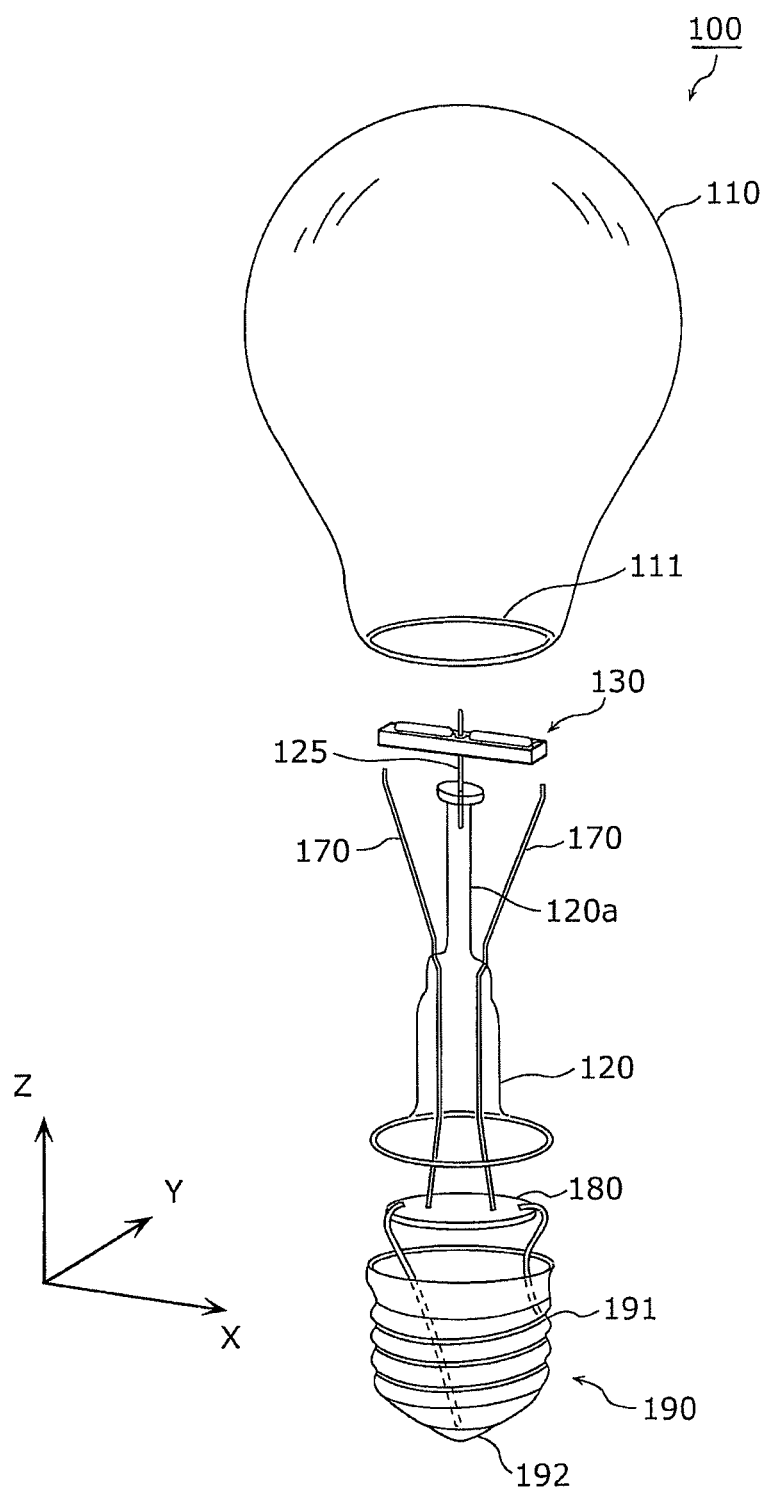
FIG. 2 is an exploded perspective view of the light bulb shaped lamp according to the embodiment 1 of the present invention.
Figure 3:
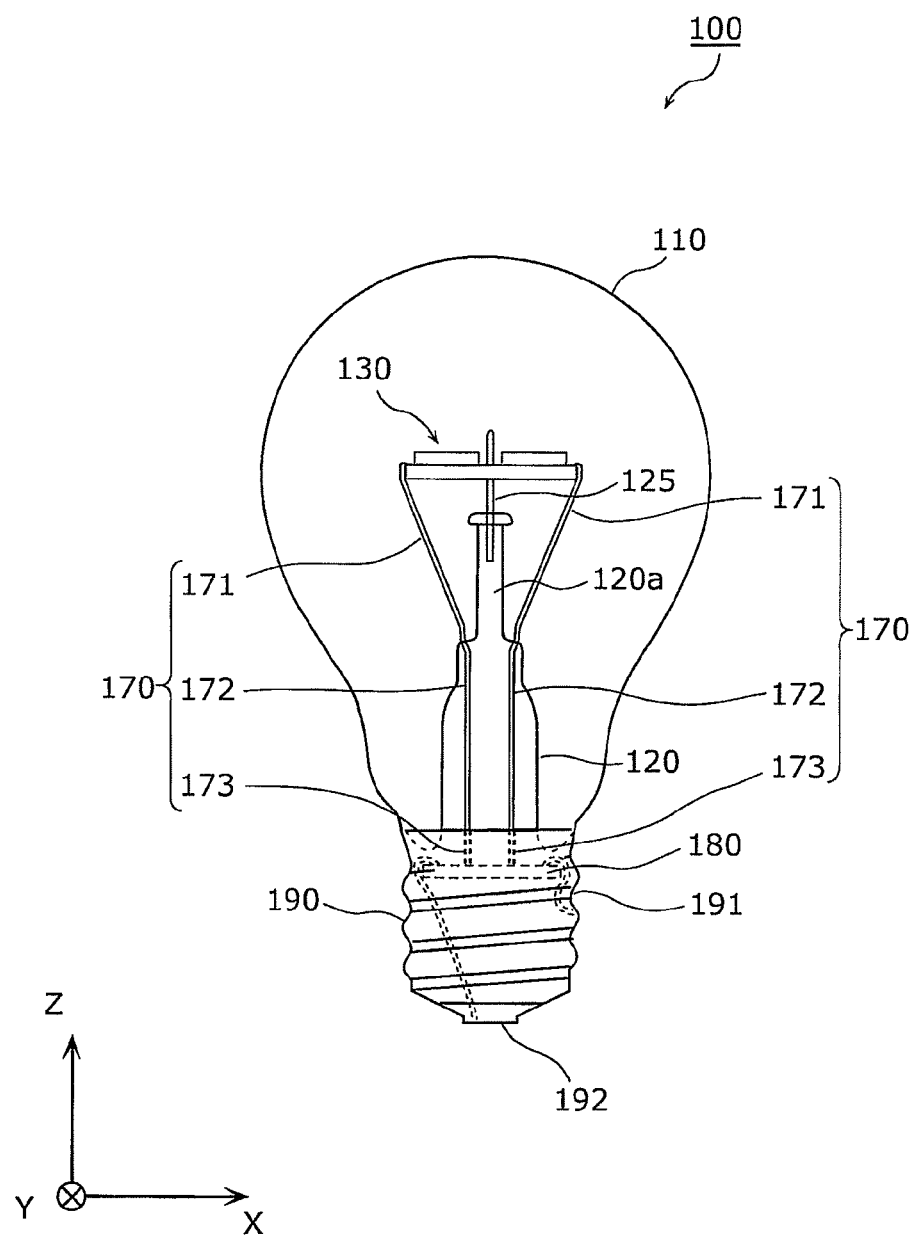
FIG. 3 is a front view of a light bulb shaped lamp according to the embodiment 1 of the present invention.

FIG. 1 is a perspective view of the light bulb shaped lamp 100 according to the embodiment 1 of the present invention. FIG. 2 is an exploded perspective view of the light bulb shaped lamp 100 according to the embodiment 1 of the present invention. FIG. 3 is a front view of the light bulb shaped lamp 100 according to the embodiment 1 of the present invention. Note that, in FIG. 3, part of the lighting circuit 180 and lead wires 170 inside a base 190 is shown in dashed lines.

The light bulb shaped lamp 100 according to the embodiment 1 is a light bulb including a translucent globe 110 and a base 190 attached to the globe 110. An LED module 130 on which an LED chip is mounted is housed in the globe 110. The regulating component 125 is inserted in a through hole 142 formed in the base platform 140 in the LED module 130, and regulates the movement of the base platform 140 with respect to the stem 120.

More specifically, as illustrated in FIG. 1 to FIG. 3, the light bulb shaped lamp 100 includes the globe 110, the stem 120, the regulating member 125, the LED module 130, the two lead wires 170, the lighting circuit 180, and the base 190.

In the following description, each component of the light bulb shaped lamp 100 shall be described in detail.

(Globe 110)

The globe 110 is a hollow component made of silica glass transparent to visible light. Accordingly, a user can see the LED module 130 housed in the globe 110 from outside of the globe 110. This structure suppresses loss of light emitted by the LED chip 150 by the globe 110. In addition, the globe 110 is highly resistant to heat.

The globe 110 has a shape with one end closed in a spherical shape, and the other end has an opening 111. In other words, the shape of the globe 110 is that a part of hollow sphere is narrowed down while extending away from the center of the sphere, and the globe 110 has an opening 111 away from the center of the sphere. In this embodiment, the shape of the globe 110 is Type A (JIS C7710) which is the same as a common incandescent light bulb.

Note that, the shape of the globe 110 does not have to be Type A. For example, the shape of the globe 110 may be Type G, Type E, or others. The globe 110 does not have to be transparent to visible light either, or made of silica glass. For example, the globe 110 may be a component made of resin such as acrylic.

(Stem 120)

The stem 120 is provided extending from the opening 111 of the globe 110 toward the inside of the globe 110. More specifically, a rod-shaped extending portion 120a extending to the vicinity of the LED module 130 in the Z-axis direction is provided in one end of the stem 120. The regulating component 125 regulating the movement of the LED module 130 is fixed to an end of the extending portion 120.

The other end of the stem 120 is formed in a flared shape coinciding with the shape of the opening 111. The other end of the stem 120 formed in the flared shape is joined with the opening 111 of the globe 110 so as to close the opening 111 of the globe 110. In addition, parts of two lead wires 170 are partially sealed in the stem 120. Accordingly, it is possible to supply power to the LED module 130 in the globe 110 from outside of the globe 110 keeping the globe 110 airtight. Accordingly, the light bulb shaped lamp 100 can prevent water or water vapor from entering the globe 110 for a long period of time, and it is possible to suppress the degradation of the LED module 130 and a part connecting the LED module 130 and the lead wire 170 due to moisture.

The stem 120 is made of soft glass transparent to visible light. This structure suppresses loss of light emitted by the LED chip 150 by the stem 120. In addition, the light bulb shaped lamp 100 can prevent the shadow cast by the stem 120. Furthermore, the stem 120 shines through white light generated by the LED chip 150. Thus, the light bulb shaped lamp 100 can achieve visually superior appearance.

Note that, it is not necessary for the stem 120 to be transparent to the visible light, or be made of soft glass. For example, the stem 120 may be a component made of highly heat-conductive resin. As the highly heat-conductive resin, silicone resin in which metal particles such as alumina or zinc oxide are mixed may be used. In this case, the light bulb shaped lamp 100 is capable of actively transferring the heat generated at the LED module 130 to the globe 110 or the base 190 through the regulating component 125 and the stem 120. As a result, the light bulb shaped lamp 100 is capable of suppressing reduction in light-emission efficacy and reduction in product life of the LED chip 150 due to increased temperature.

The stem 120 does not necessarily close the opening 111 of the globe 110, and may be attached to a part of the opening 111.

(Regulating Component 125)

Figure 4:
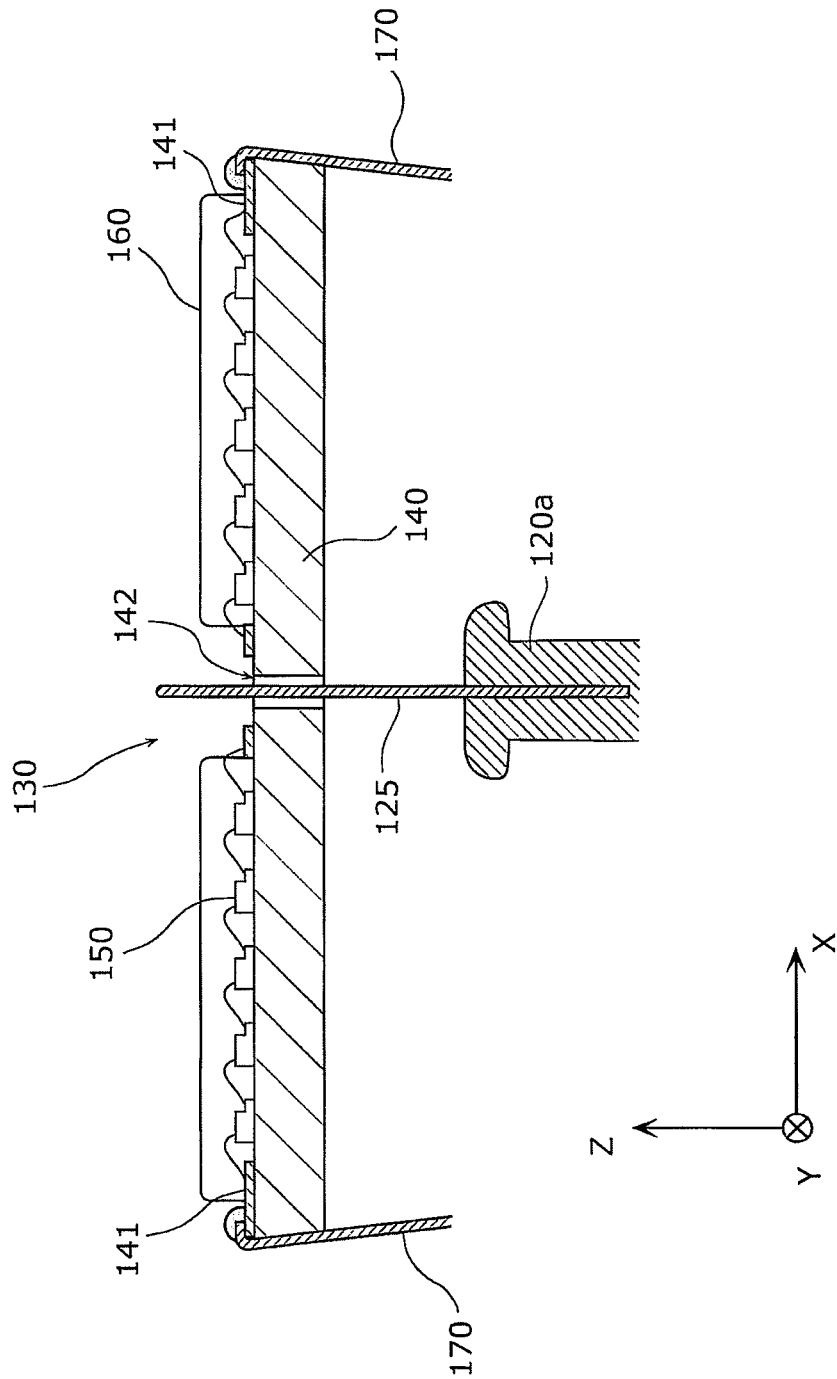
FIG. 4 is a cross-sectional view of components around an LED module according to the embodiment 1 of the present invention in the Y-axis direction.

FIG. 4 is a cross-sectional view of components around the LED module 130 according to the embodiment 1 of the present invention in the Y-axis direction. As illustrated in FIG. 4, the regulating component 125 is a linear component made of metal, for example, which is inserted into the through hole 142, and regulates the movement of the 140. In the embodiment 1, the regulating component 125 is fixed to the end of the extending portion 120a and extending in a straight line toward the LED module 130. The regulating component 125 has strength sufficient for regulating the movement of the LED module 130 in the horizontal plane (XY plane).

Note that the regulating component 125 does not have to be a metal component, and maybe a component made of resin such as resin transparent to visible light, for example. Stated differently, the regulating component 125 may be a component made of any material as long as the material has strength sufficient for regulating the movement of the LED module 130 through the through hole 142.

(LED Module 130)

The LED module 130 corresponds to a light-emitting module, and is housed in the globe 110. It is preferable that the LED module 130 is arranged at the center of the sphere formed by the globe 110 (for example, inside the part having a large diameter of the globe 110). Since the LED module 130 is arranged at the center as described above, the light bulb-shaped LED lamp 100 can achieve omnidirectional light distribution property approximated to that of a general incandescent lamp using a conventional filament coil.

As illustrated in FIG. 4, the LED module 130 has the base platform 140, a plurality of LED chips 150, and the sealing material 160. The LED module 130 is arranged such that the surface on which the LED chips 150 are mounted is facing toward the top of the globe 110 (toward the positive direction of the Z-axis direction).

(Base Platform 140)

The base platform 140 is composed of a material translucent to the visible light emitted from the sealing material 160, more specifically a ceramic component including alumina. The through hole 142 passing the base platform 140 through in the Z-axis direction is formed at the central part of the base platform 140. The regulating component 125 is inserted into the through hole 142.

Note that, it is preferable that the base platform 140 is made of a material having high transmittance of visible light. Accordingly, the light emitted from LED chip 150 is transmitted through the inside of the base platform 140, and is emitted from a surface on which no LED chip 150 is mounted. Accordingly, even when the LED chips 150 are mounted only on one side of the base platform 140, the light is emitted from the other sides, which allows light distribution property equivalent or similar to the incandescent lamp.

Note that, it is not necessary for the base platform 140 to be translucent. In this case, the LED chip 150 may be mounted on a plurality of sides of the base platform 140.

The shape of the base platform 140 is a quadrilateral prism (20 mm in length (X-axis direction), 1 mm in width (Y-axis direction), and 0.8 mm in thickness (Z-axis direction)). Since the base platform 140 is prism-shaped, the light bulb shaped lamp 100 is capable of reproducing the LED module 130 imitating the filament coil of the incandescent light bulb. Note that, the shape and size of the base platform 140 is an example, and may be other shape of size.

A power supply terminal 141 is provided on each of the ends of the base platform 140 in the longer direction (X-axis direction). Each of the two lead wires 170 is electrically and physically connected to the power supply terminal 141 by solder.

Note that, it is preferable that the base platform 140 is a component having a high thermal conductivity and high thermal emissivity in heat radiation so as to increase the heat-dissipating property. More specifically, the base platform 140 is preferably a component made of a material generally referred to as a hard brittle material such as glass and ceramic. Here, the emissivity is represented by a ratio with respect to heat emission on black body (full radiator), and has a value between 0 and 1. The emissivity of glass or ceramic is 0.75 to 0.95, and thus heat emission close to the black body radiation is achieved. In terms of practical use, the emissivity of the base platform 140 is preferably 0.8 or higher, and is more preferably 0.9 or higher.

(LED Chip 150)

The LED chip 150 is a semiconductor light-emitting device, and emits blue light when energized in the embodiment. The LED chips 150 are mounted on one side of the base platform 140. More specifically, five LED chips 150 are mounted in a straight line between the two power supply terminals 141.

Figure 5:
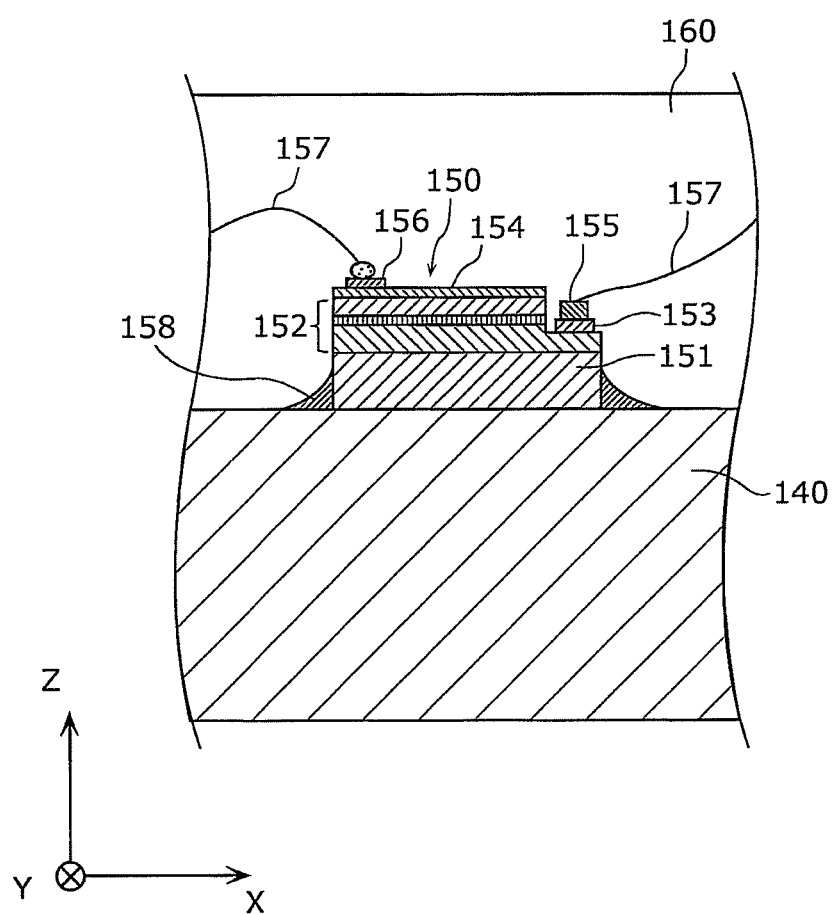
FIG. 5 is an enlarged cross-sectional view of an LED chip according to the embodiment 1 of the present invention in the Y-axis direction.

FIG. 5 is an enlarged cross-sectional view of the LED chip 150 according to the embodiment 1 of the present invention in the Y-axis direction.

As illustrated in FIG. 5, the LED chip 150 has a vertically long shape (600 μm in length, 300 μm in width, and 100 μm in thickness).

The LED chip 150 includes a sapphire board 151 and nitride semiconductor layers 152 each having different compositions, which are stacked above the sapphire board 151.

A cathode 153 and an anode 154 are formed at an end portion of the upper surface of the nitride semiconductor layer 152. Wire bonding portions 155 and 156 are formed on the cathode 153 and the anode 154, respectively.

The cathode 153 and the anode 154 in the LED chips 150 next to each other are electrically connected in series by a gold wire 157 through the wire bonding portions 155 and 156. The cathode 153 or the anode 154 in the LED chips 150 at the ends is connected to a power supply terminal 141 by the gold wire 157.

Each of the LED chips 150 is mounted on the base platform 140 by translucent chip bonding material 158 such that a surface of the LED chip 150 on the sapphire board 151 side faces the mounting surface of the base platform 140.

Silicone resin including filler made of metal oxide may be used as the chip bonding material, for example. Using the translucent material for the chip bonding material can reduce the loss of light emitted from the surface of the LED chip 150 on the side of the sapphire board 151 and the side surfaces of the LED chip 150, preventing the shadow cast by the chip bonding material.

Note that, an example in which the plurality of LED chips 150 are mounted on the base platform 140. However, the number of the LED chips 150 may be changed appropriately to the use of the light bulb shaped lamp 100. For example, as a replacement for a miniature light bulb, one LED chip 150 may be mounted on the base platform 140.

(Sealing Material 160)

The sealing material 160 is a material having translucent property, and is provided so as to cover the LED chips 150. More specifically, the sealing material 160 is made of a translucent resin such as silicone resin, and includes phosphor particles (not illustrated) which is a wavelength-conversion material and light-diffusion material (not illustrated).

The sealing material 160 is formed by the following two processes, for example. First, in the first process, the sealing material 160 which is an uncured paste including the wavelength conversion material is applied in a continuous straight line on the LED chips 150 by a dispenser. Next, in the second process, the applied paste of sealing material 160 is cured.

The cross-section in X-axis direction of the sealing material 160 formed as described above is dome-shaped, and is 1 mm wide and 0.2 mm high. Note that, the width of the sealing material 160 in the Y-axis direction is approximately the same as the width of the base platform 140.

Part of the blue light emitted by the LED chip 150 is absorbed by the wavelength conversion material contained in the sealing material 160, and is converted into light having another wavelength. For example, when a YAG phosphor such as $(Y, Gd)_3Al_5O_{12}:Ce^{3+}$, or $Y_3Al_5O_{12}:Ce^{3+}$ is used as the wavelength conversion material, part of the blue light emitted by the LED chip 150 is converted into yellow light. The blue light which is not absorbed by the wavelength conversion material and the yellow light converted by the wavelength conversion material are diffused and mixed in the sealing material 160, and is emitted as white light from the sealing material 160.

Particles such as silica are used as the light diffusion material. In the embodiment 1, the translucent base platform 140 is used. Thus, the white light emitted from the linear sealing material 160 is transmitted the inside of the base platform 140, and is emitted from the side of the base platform 140 on which the LED chip 150 is not mounted. Thus, the base platform 140 appears shining like a filament coil of the conventional incandescent light bulb from any surface of the base platform 140 in the prism shape when energized.

Note that, the sealing material 160 may be provided on a surface of the base platform 140 on which the LED chip 150 is not mounted. With this, part of the blue light which transmits inside the base platform 140 and is emitted from the side surfaces on which no LED chip 150 is mounted is converted to yellow light. Accordingly, it is possible to change the color of light emitted from the side surfaces on which no LED chip 150 is mounted closer to the color of light is directly emitted from the sealing material 160.

Note that, the wavelength conversion material included in the sealing material 160 may be a yellow phosphor such as $(Sr, Ba)_2SiO_4:Eu2+$, $Sr_3SiO_5:Eu2+$, for example. Alternatively, the wavelength conversion material may be a green phosphor such as $(Ba, Sr)_2SiO_4:Eu^{2+}$, $Ba_3Si_6O_{12}N_2:Eu^{2+}$. Alternatively, the wavelength conversion material may be a red phosphor such as $CaAlSiN_3:Eu^{2+}$, $Sr_2(Si, Al)_5(N, O)_8: Eu^{2+}$.

The sealing material 160 may not be necessarily be made of silicone resin, and may be made of an organic material such as fluorine series resin or an inorganic material such as a low-melting-point glass or a sol-gel glass. Since the inorganic materials are more highly resistant to heat than the organic material, the sealing material 160 made of an inorganic material is advantageous to increasing luminance.

(Lead Wire 170)

The two lead wires 170 support the LED module 130, and hold the LED module 130 at a constant position in the globe 110. The power supplied from the base 190 is supplied to the LED chips 150 through the two lead wires 170. Each of the lead wires 170 is a composite wire including an internal lead wire 171, a Dumet wire (copper-clad nickel steel wire) 172 and an external lead wire 173 joined in this order, and has strength sufficient to support the LED module 130.

The internal lead wire 171 extends from the stem 120 toward the LED module 130, and the tip of the internal lead wire 171 bent in L-shaped is joined with the base platform 140, which supports the LED module 130. The Dumet wire 172 is sealed in the stem 120. The external lead wire 173 extends from the lighting circuit 180 to the stem 120.

Here, it is preferable that the lead wire 170 is a metal wire including copper having high thermal conductivity. With this, the heat generated at the LED module 130 can be actively transferred to the base 190 through the lead wire 170.

Note that, the lead wire 170 does not necessarily have to be a composite wire, and may be a single wire made of the same metal wire. In addition, two lead wires 170 do not have to be provided. For example, when the light bulb shaped lamp 100 includes a plurality of the LED modules 130 in the globe 110, two lead wires 170 may be provided for each of the LED modules 130. Accordingly, the light bulb shaped lamp 100 may have the lead wires 170 twice in number as the number of the LED modules 130.

(Lighting Circuit 180)

The lighting circuit 180 is a circuit for causing the LED chips 150 to emit light, and is housed in the base 190. More specifically, the lighting circuit 180 includes a plurality of circuit elements, and a circuit board on which each of the circuit elements is mounted. In this embodiment, the lighting circuit 180 converts the AC power received from the base 190 to the DC power, and supplies the DC power to the LED chips 150 through the two lead wires 170.

Figure 6:
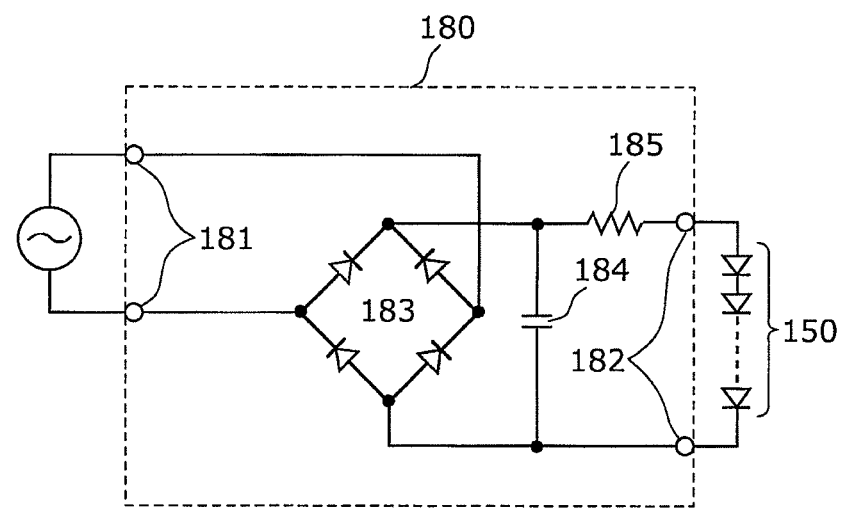
FIG. 6 is a circuit diagram of a lighting circuit according to the embodiment 1 of the present invention.

FIG. 6 is a circuit diagram of the lighting circuit 180 according to the embodiment 1 of the present invention. As illustrated in FIG. 6, the lighting circuit 180 includes a diode bridge 183 for rectification, a capacitor 184 for smoothing, and a resistor 185 for adjusting current. Input terminals of the diode bridge 183 are connected to input terminals 181 of the lighting circuit 180. One of the output terminals of the diode bridge 183 and one end of the resistor 183 are connected to the output terminals 182 of the lighting circuit 180. An end of the capacitor 184 and the other end of the resistor 185 are connected to the other of the output terminals of the diode bridge 183.

The input terminal 181 is electrically connected to the base 190. More specifically, one of the input terminals 181 is connected to the screw 191 on the side surface of the base 190. The other of the input terminals 181 is connected to an eyelet 192 at the bottom of the base 190.

The output terminals 182 are connected to the lead wires 170, and are electrically connected to the LED chips 150.

Note that, the light bulb shaped lamp 100 does not have to include the lighting circuit 180. For example, the lighting circuit 180 is not necessary for the light bulb shaped lamp 100 when the DC power is directly supplied from a battery cell or others. In this case, one of the external lead wires 173 is connected to the screw 191, and the other of the external lead wire 173 is connected to the eyelet 192.

Note that, the lighting circuit 180 is not limited to a smoothing circuit, but may be an appropriate combination of light-adjusting circuit, voltage booster, and others.

(Base 190)

The base 190 is provided at the opening 111 of the globe 110. More specifically, the base 190 is attached to the globe 110 using an adhesive such as cement to cover the opening 111 of the globe 110. In this embodiment, the base 190 is an E26 base. The light bulb shaped lamp 100 is attached to a socket for E26 base connected to the commercial AC power source for use.

Note that, the base 190 does not have to be an E26 base, and maybe a base of other size, such as E17. In addition, the base 190 does not have to be a screw base, and may be a base in a different shape such as a plug-in base.

Alternatively, the base 190 is directly attached to the opening 111 of the globe 110. However, it is not limited to this example. The base 190 may be indirectly attached to the globe 110. For example, the base 190 may be attached to the globe 110 through a component made of resin such as a resin case. The circuit 180 and others may be housed in the resin case, for example.

As described above, according to the light bulb shaped lamp 100 according to the embodiment 1, the movement of the LED module 130 can be regulated by the regulating component 125 inserted into the through hole 142 in the base platform 140. Accordingly, when the light bulb shaped lamp 100 is shaken, for example, the stress on the part connecting the lead wire 170 and the LED module 130 is suppressed, which suppresses the possibility of the lead wire 170 being disconnected from the LED module 130. Furthermore, the base 190 is provided in the opening 111 of the globe 110 housing the LED module 130 inside. Accordingly, the light emitted by the LED chips 150 is not blocked by the case, and light distribution property equivalent or similar to the conventional incandescent light bulb can be achieved.

A variation of the light bulb shaped lamp 100 according to the embodiment 1 of the present invention shall be described below.

Variation 1 of Embodiment 1

First, the variation 1 of the embodiment 1 of the present invention shall be described.

The light bulb shaped lamp according to the variation 1 of the embodiment 1 of the present invention is different from the light bulb shaped lamp according to the embodiment 1 mostly from the shape of the regulating component 125. The following shall describe the light bulb shaped lamp according to the variation with reference to the drawings. Note that, in the variation, the illustration and description for the components identical to the components according to the light bulb shaped lamp according to the embodiment 1 are omitted where appropriate.

Figure 8:
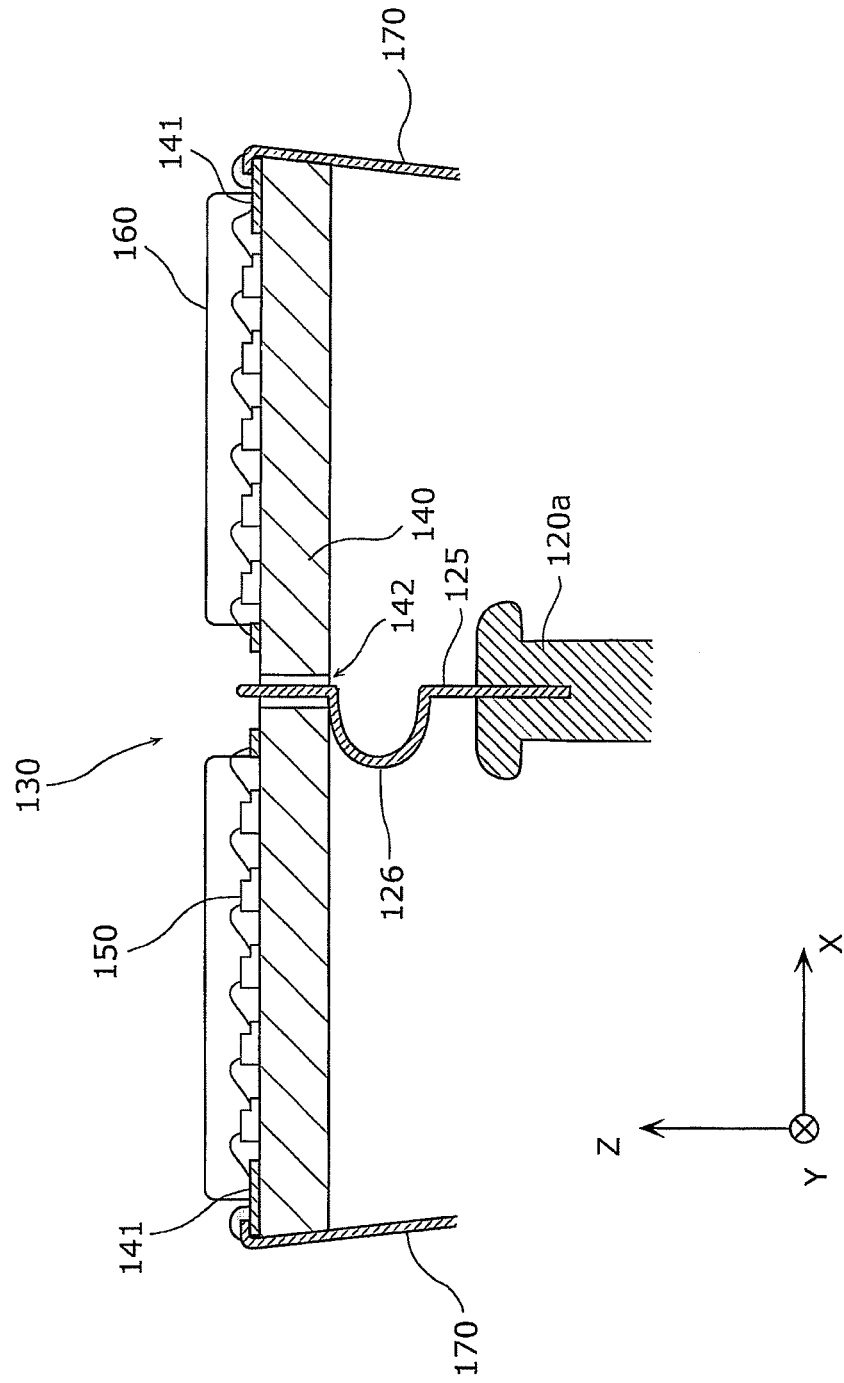
FIG. 8 is a cross-sectional view of components around the LED module according to the variation 1 of the embodiment 1 of the present invention.

FIG. 7 is a perspective view around the LED module 130 according to the variation 1 of the embodiment 1 of the present invention. FIG. 8 is a cross-sectional view around the LED module 130 according to the variation 1 of the embodiment 1 of the present invention in the Y-axis direction.

As illustrated in (a) in FIG. 7, the regulating component 125 of the light bulb shaped lamp 100 according to the variation has a supporting part 126 supporting the base platform 140 from the side of the stem 120. The supporting part 126 is a bent part of the regulating component 125, and is formed between the stem 120 and the base platform 140. In this embodiment, the bent part is U-shaped.

As described above, since the regulating component 125 has the supporting part 126, the light bulb shaped lamp 100 can regulate the movement of the base platform 140 toward the side of the stem 120 (negative direction in the Z-axis direction). In addition, since the supporting part 126 formed in U-shape has elasticity in the Z-axis direction; the supporting part 126 can absorb the vibration in the Z-axis direction.

Furthermore, as illustrated in (b) in FIG. 7, the end portion 127 of the regulating component 125 is bent to the L-shape after inserted into the through hole 142 in the base platform 140. Stated differently, the end portion 127 projecting from the through hole 142 in the regulating component 125 is bent. With this, the movement of the base platform 140 toward the direction moving away from the stem 120 (positive direction in the Z-axis direction) is regulated.

As described above, according to the light bulb shaped lamp 100 according to the variation, the regulating component 125 can regulate the movement of the LED module 130 not only in the horizontal direction (the X-axis direction and Y-axis direction) but also in the vertical direction (the Z-axis direction). Accordingly, when the light bulb shaped lamp 100 is shaken, for example, the regulating component 125 more securely reduces the possibility of the lead wires 170 being disconnected from the LED module 130.

Note that, it is not necessary for the supporting part 126 to be U-shaped. The supporting part 126 may be in the square U-shape or the coil shape, for example. More specifically, the supporting part 126 may be in any shape as long as the supporting part 126 can regulate the movement of the base platform 140 toward the stem 120 along the regulating component 125.

Variation 2 of Embodiment 2

Next, the variation 2 of the embodiment 1 of the present invention shall be described.

The feature of the light bulb shaped lamp 100 according to the variation 2 of the embodiment 1 is that the end portion 127 projecting from the through hole 142 in the regulating component 125 is fixed to the base platform 180 by a joining material 128. The following shall describe the light bulb shaped lamp according to the variation with reference to the drawings. Note that, in the variation, the illustration and description for the components identical to the components according to the light bulb shaped lamp according to the variation 1 of the embodiment 1 are omitted where appropriate.

Figure 9:
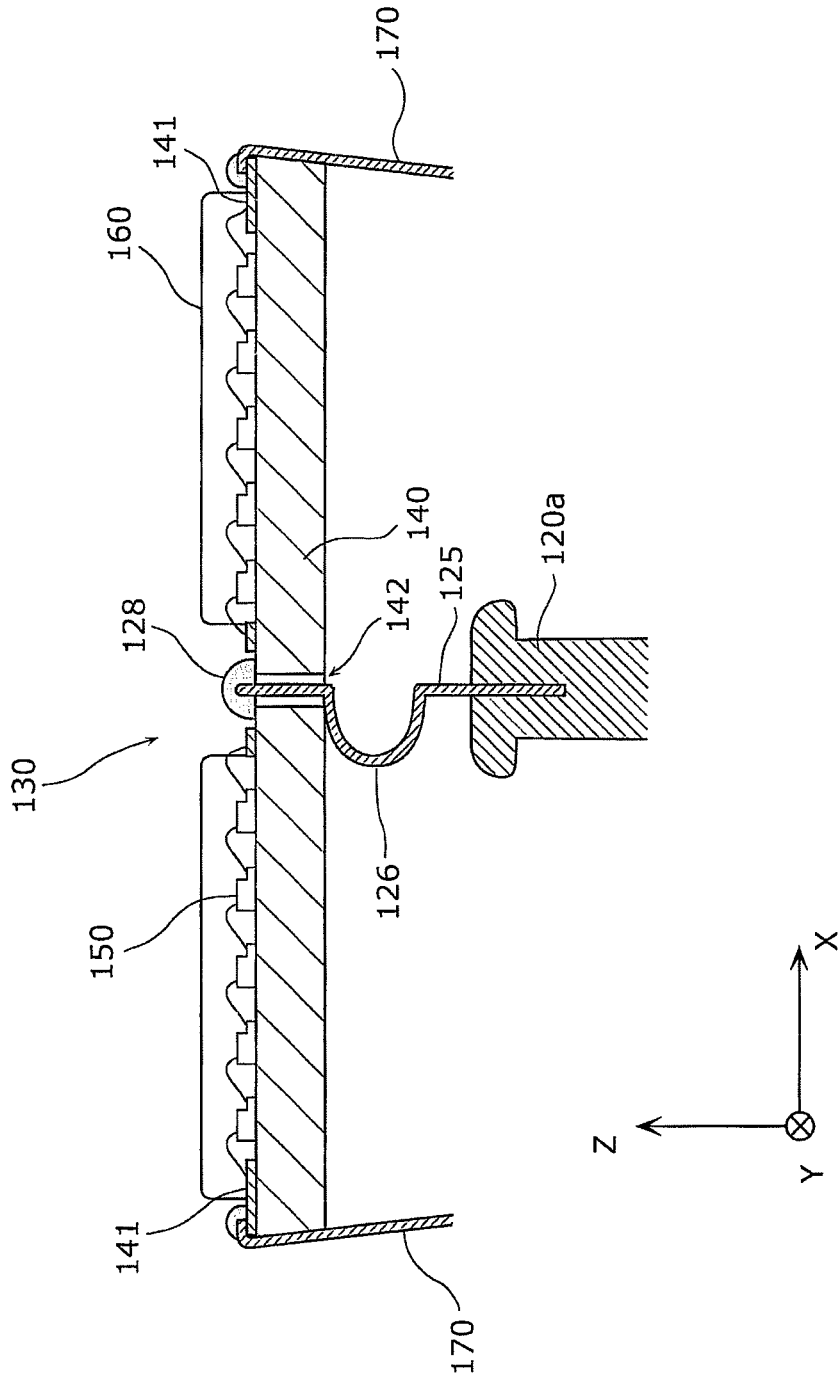
FIG. 9 is a cross-sectional view of components around the LED module according to the variation 2 of the embodiment 1 of the present invention.

FIG. 9 is a perspective view around the LED module 130 according to the variation 2 of the embodiment 1 of the present invention.

As illustrated in FIG. 9, the end portion 127 of the regulating component 125 is fixed to the base platform 140 by the joining material 128. More specifically, the end portion 127 is joined to a side surface of the base platform 140 by solder on one side of the globe 110 closer to the globe 110. Accordingly, the movement of the LED module 130 can be regulated further, and it is possible to even more securely reduce the possibility of the lead wire 170 coming off of the base platform 140 by vibration or others.

Note that the joining material 128 does not necessarily be solder, but adhesive made of silicone resin. More specifically, the joining material 128 may be any material as long as the regulating component 125 is fixed to the base platform 140, and may be changed appropriately depending on the material of the regulating component 125.

Embodiment 2

First, a light bulb shaped lamp 100 according to the embodiment 2 of the present invention shall be described.

The light bulb shaped lamp according to the embodiment 2 is different from the light bulb shaped lamp according to the embodiment 1 in the shape and structure of the base platform 140 and the regulating component 125. The following shall describe the light bulb shaped lamp according to the embodiment with reference to the drawings. Note that, in the following embodiment, illustration and description for the components identical to the components in the light bulb shaped lamp according to the embodiment 1 shall be omitted where appropriate.

Figure 10:
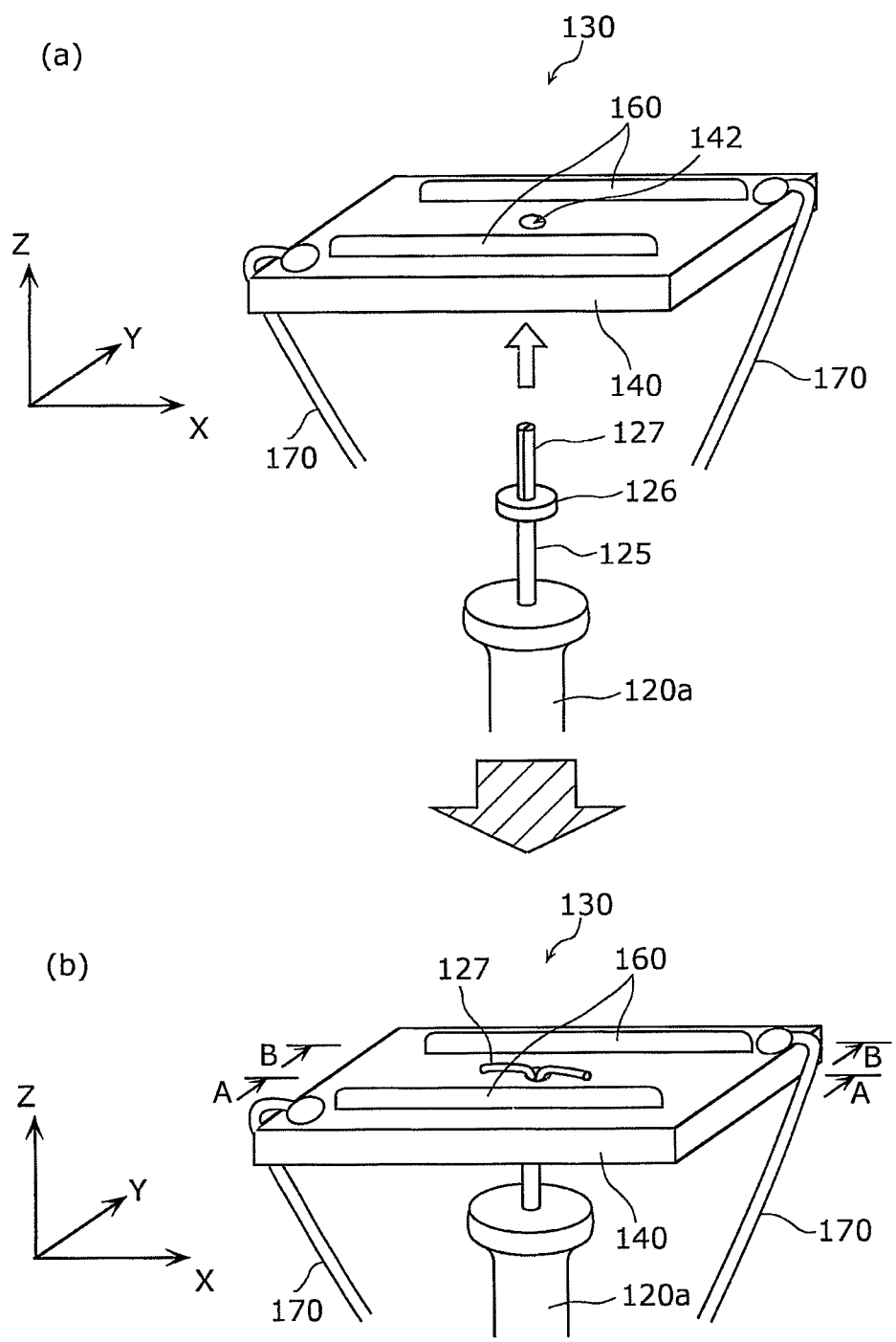
FIGS. 10(a) and (b) are perspective views of components around an LED module according to the embodiment 2 of the present invention.
Figure 11A:
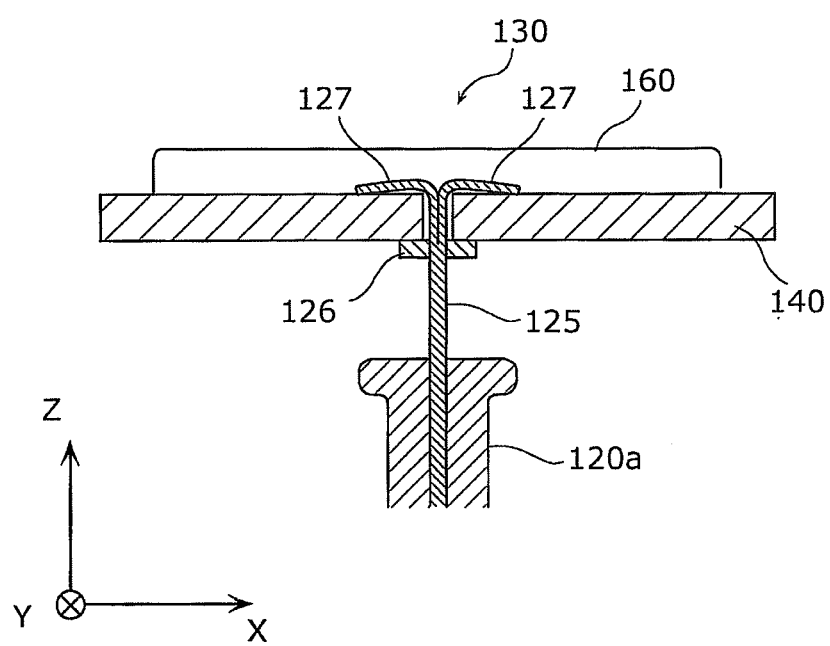
FIG. 11A is a cross-sectional view of components around an LED module according to the embodiment 2 of the present invention in the A-A cross-section.
Figure 11B:
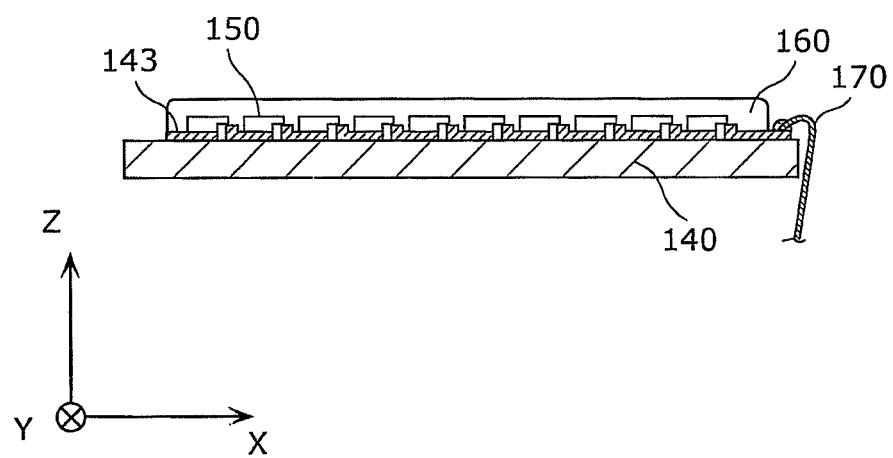
FIG. 11B is a cross-sectional view of components around an LED module according to the embodiment 2 of the present invention in the B-B cross section.

FIG. 10 is a perspective view of the components around an LED module 130 according to the embodiment 2 of the present invention. FIG. 11A and FIG. 11B are cross-sectional views of components around the LED module 130 according to the embodiment 2 of the present invention in the Y-axis direction. More specifically, FIG. 11A is a cross-sectional view in A-A cross-section in (b) in FIG. 10, and FIG. 11B is a cross-sectional view in B-B cross-section in (b) in FIG. 10.

The regulating component 125 is fixed to the end of the extending portion 120a of the stem 120, and is inserted into the through hole 142 in the base platform 140. The regulating component 125 also includes a supporting part 126 supporting the base platform 140 from the side of the stem 120. The supporting part 126 is a component having a width larger than the width of the through hole 142, and is provided between the tip of the extending portion 120a and the base platform 140.

Here, the width of the through hole 142 and the width of the supporting part 126 is a length in a direction parallel to the opening plane of the through hole 142. Stated differently, the supporting part 126 has a shape which makes the supporting part 126 unable to pass through the through hole 142 when the supporting part 126 is in a predetermined installation state.

Furthermore, the end portion 127 of the regulating component 125 is cut in the axial direction (Z-axis direction) of the regulating component 125. Accordingly, the end portion 127 of the regulating component 125 inserted into the through hole 142 is split into two pieces. The end portion 127 having two split pieces is inserted into the through hole 142 ((a) in FIG. 10), and then the two pieces are bent in different directions ((b) in FIG. 10).

The base platform 140 is a translucent ceramic material containing aluminum nitride. The base platform 140 is board-shaped (20 mm in length, 10 mm in width, and 0.8 mm in thickness), and the through hole 142 passing though the base platform 140 in the Z-axis direction is formed at the central part of the base platform 140.

Each of the power supply terminals 141 is provided at a diagonal corner of the base platform 140. Each of the two lead wires 170 is electrically and physically connected to the power supply terminal 141 provided at the diagonal corner by solder.

Furthermore, as illustrated in FIG. 11B, a metal line pattern 143 is formed on one side (surface) of the base platform 140, and the LED chips 150 are mounted. The power is supplied to the LED chips 150 through the metal line pattern 143. Note that, the line pattern may be formed of a translucent conductive material such as indium tin oxide (ITO). In this case, it is possible to suppress the loss of the light generated by the LED chip 150 by the line pattern, compared to the metal line pattern.

The LED chip 150 is a semiconductor light-emitting device which emits violet light when energized. More specifically, one row consists of 10 LED chips 150, and 20 LED chips 150 are mounted in two rows. With this, the light bulb shaped lamp 100 can reproduce the incandescent light bulb having two filament coils.

The sealing material 160 is a material having translucent property, and is provided so as to cover a row of the LED chips 150. The sealing material 160 includes a blue phosphor, a green phosphor, and a red phosphor as wavelength conversion materials. Accordingly, the violet light generated by the LED chip 150 is converted into white light.

As described above, according to the light bulb shaped lamp 100 according to the variation, the supporting part 126 has a width larger than the width of the through hole 142, it is possible to regulate the movement of the LED module 130 toward the stem 120. Therefore, it is possible to prevent the lead wire 170 from being disconnected from the base platform 140 by vibration or others.

Note that, the supporting part 126 is a circular plate in this embodiment. However, the shape of the supporting part 126 is not limited to a circular plate. For example, the supporting part 126 may be prism-shaped or cone-shaped. Stated differently, the supporting part 126 may be in any shape as long as the supporting part 126 is unable to pass through the through hole 142 in the predetermined installation state.

Variation of Embodiment 2

Next, a variation of the light bulb shaped lamp 100 according to the embodiment 2 of the present invention shall be described.

The light bulb shaped lamp according to the variation is different from the light bulb shaped lamp according to the embodiment 2 in the structure of the end portion 127 of the regulating component 125. The following shall describe the light bulb shaped lamp according to the variation with reference to the drawings. Note that, in the following variation, illustration and description for the components identical to the components in the light bulb shaped lamp according to the embodiment 2 shall be omitted where appropriate.

Figure 12:
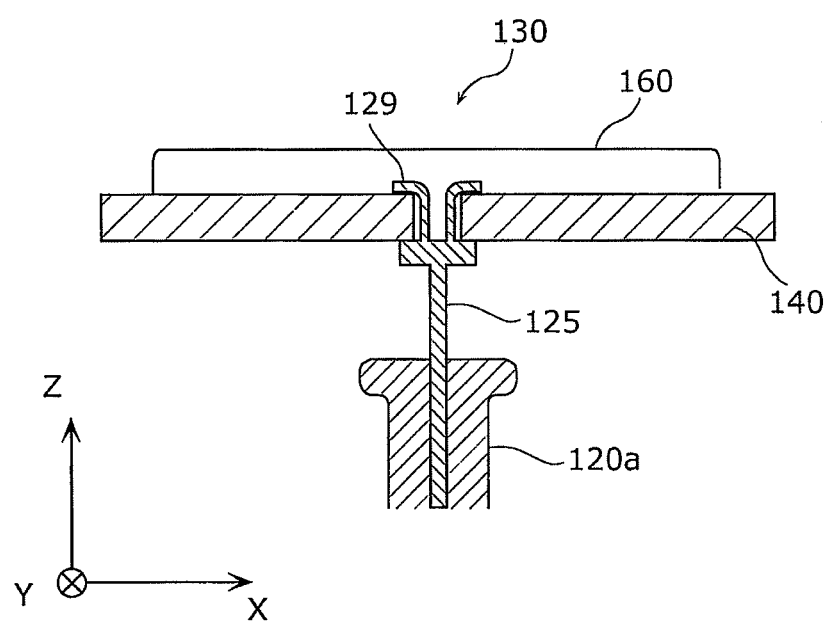
FIG. 12 is a cross-sectional view of components around the LED module according to the variation of the embodiment 2 of the present invention.

FIG. 12 is a cross-sectional view of the components around an LED module 130 according to the variation of the embodiment 2 of the present invention in the Y-axis direction. As illustrated in FIG. 12, the regulating component 125 includes a rivet 129 at the end. Stated differently, the regulating component 125 is fixed to the base platform 140 after inserted through the through hole 142 and crimped at the end. It is preferable that the rivet 129 is a tube-shaped having a hole (generally known as an eyelet).

As described above, according to the light bulb shaped lamp 100 according to the variation, the rivet 129 is provided at the end of the regulating component 125. Accordingly, the movement of the base platform 140 is regulated even more firmly. Therefore, it is possible to reduce the possibility of the lead wire being disconnected from the lead wire by vibration and others.

Embodiment 3

Next, the embodiment 3 of the present invention shall be described.

The light bulb shaped lamp according to the embodiment 3 is different from the light bulb shaped lamp according to the embodiment 1 or 2 in that the regulating component 125 functions as the lead wire. The following shall describe the light bulb shaped lamp according to the embodiment with reference to the drawings. Note that, in the following embodiment, illustration and description for the components identical to the components in the light bulb shaped lamp according to the embodiment 1 or 2 shall be omitted where appropriate.

Figure 13:
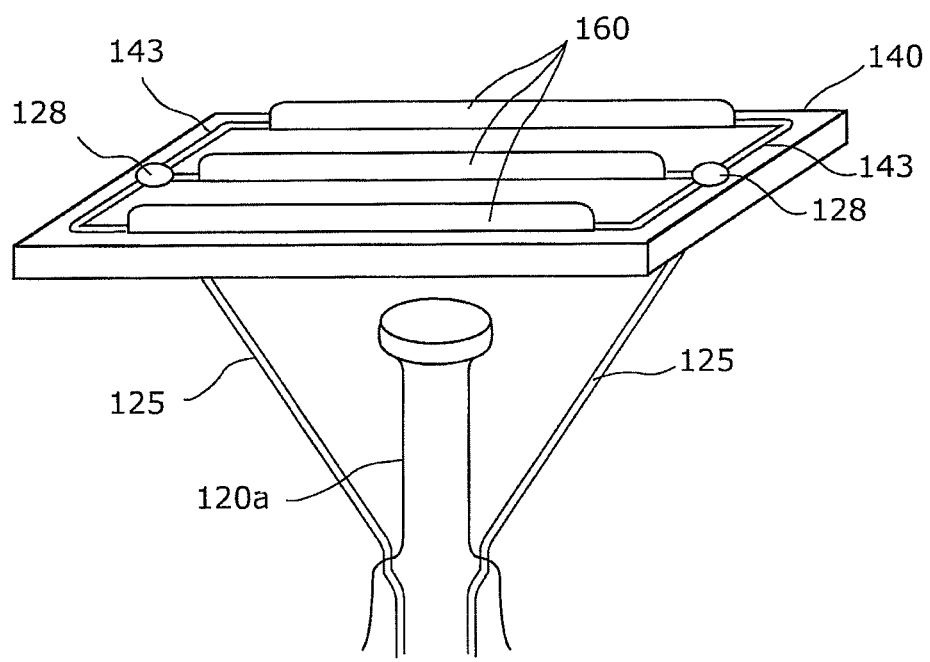
FIG. 13 is a perspective view of components around an LED module according to the embodiment 3 of the present invention.
Figure 14:
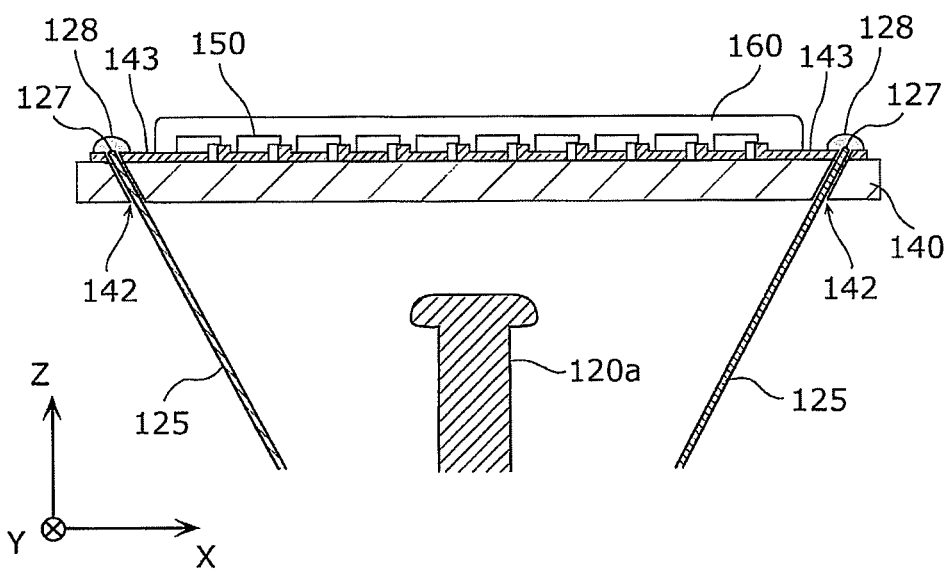
FIG. 14 is a cross-sectional view of components around the LED module according to the embodiment 3 of the present invention.

FIG. 13 is a perspective view of the components around an LED module 130 according to the embodiment 3 of the present invention. FIG. 14 is a cross-sectional view of components around the LED module 130 according to the embodiment 3 of the present invention in the Y-axis direction.

The base platform 140 has two different through holes 142 having axial directions different from each other. Each of the two regulating components 125 is inserted into the through hole 142. More specifically, one row consists of 10 LED chips 150, and 30 LED chips 150 are mounted in three rows.

The regulating component 125 is a lead wire for supplying power from the base 190 to the LED module 130. Furthermore, the regulating component 125 supports the LED module 130 in the globe 110. To put it differently, the regulating component 125 is identical to the lead wire 170 in the embodiment 1 or 2.

In the embodiment 2, the regulating component 125 is inserted into the through hole 142, as illustrated in FIG. 14. The end portion 127 of the regulating component 125 is fixed to the base platform 140 by a joining material 128 such as solder. More specifically, the end portion 127 of the regulating component 125 is physically and electrically connected to the metal line pattern 143 formed on the base platform 140, for example. Here, the three rows of LED chips 150 are connected in parallel.

As described above, in the light bulb shaped lamp 100 according to the embodiment, the regulating component 125 functions as a lead wire as well, which simplifies the structure of the light bulb shaped lamp 100. Furthermore, the lead wire is inserted into the through hole 142 of the base platform 140. Accordingly, it is possible to diffuse the stress on the part connecting the lead wire and the LED module 130 exerted due to vibration and others.

Furthermore, according to the light bulb shaped lamp 100 according to the embodiment, the axial directions of the two through holes 142 are different from each other. Accordingly, even if a force is exerted on the base platform 140 in the axial direction of one of the through holes 142, it is possible to regulate the movement of the base platform 140 toward the direction of the force by the regulating component 125 inserted into the other through hole 142.

Therefore, the light bulb shaped lamp 100 according to the embodiment 3 is capable of reducing the possibility of the base platform 140 falling off due to the vibration or others even more securely, by using the regulating component (lead wire).

Variation of Embodiment 3

Next, a variation of the light bulb shaped lamp 100 according to the embodiment 3 of the present invention shall be described.

The light bulb shaped lamp according to the variation is different from the light bulb shaped lamp according to the embodiment 3 in that a board component 121 is included instead of the stem 120. The following shall describe the light bulb shaped lamp according to the variation with reference to the drawings. Note that, in the following variation, illustration and description for the components identical to the components in the light bulb shaped lamp according to the embodiment 3 shall be omitted where appropriate.

Figure 15:
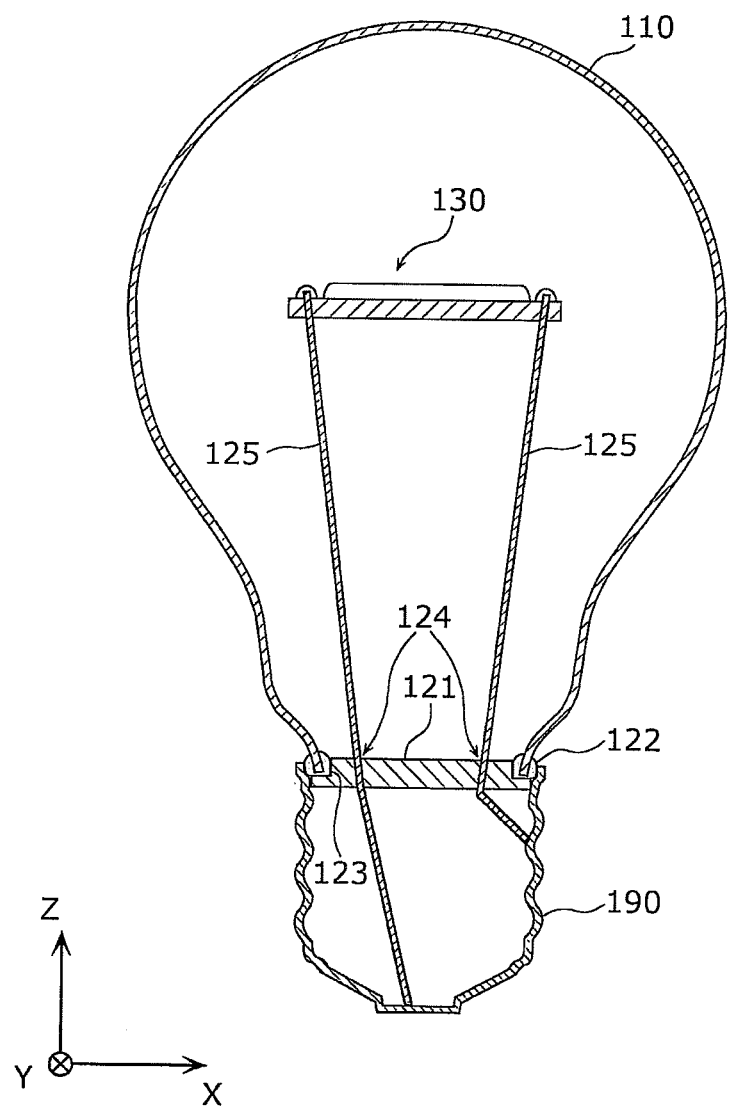
FIG. 15 is a front view of a light bulb shaped lamp according to the variation of the embodiment 3 of the present invention.

FIG. 15 is a cross-sectional view of the light bulb shaped lamp 100 according to the variation of the embodiment 3 of the present invention in the Y-axis direction. As illustrated in FIG. 15, the light bulb shaped lamp 100 includes the board component 121.

The board component 121 is fit into the opening 111 of the base 190, and a cutout 123 is provided at the periphery of the board component 121. The opening 111 of the globe 110 is inserted into the groove formed by the cutout 123 and the base 190, and is fixed by an adhesive material 122 made of silicone resin and others. The board component 121 includes a through hole 124. The regulating component 125 (lead wire) is inserted into the through hole 124, and fixed to the board component 121.

As described above, even if the light bulb shaped lamp 100 does not include the stem 120, the regulating component 125 can support the LED module 130 in the globe 110.

Figure 16:
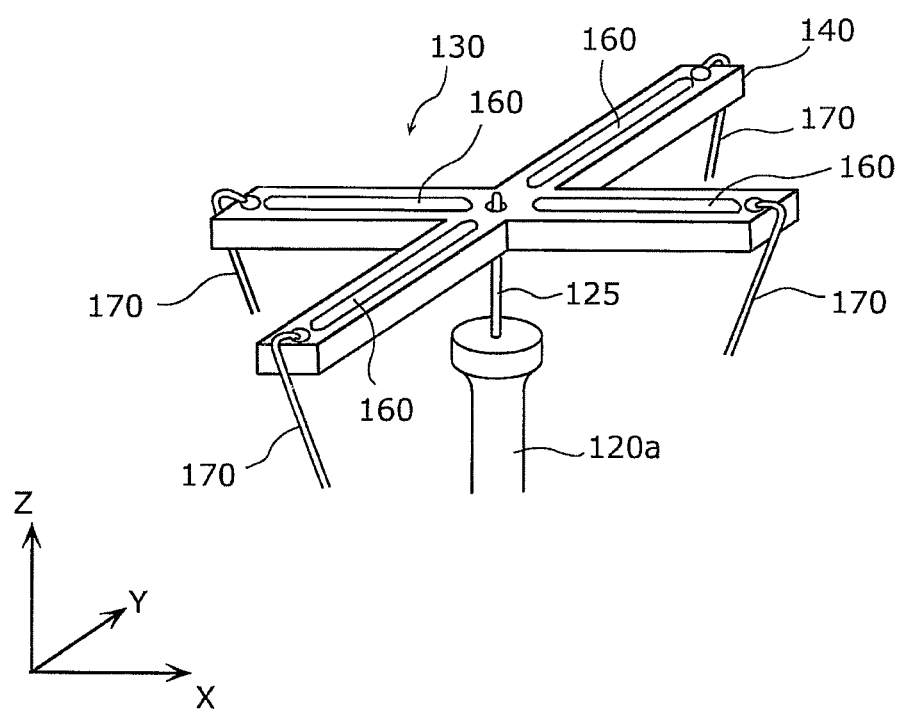
FIG. 16 is a perspective view of components around an LED module according to an aspect of the present invention.

Note that, in the embodiments 1 to 3, the base platform 140 is prism-shaped or board shaped. However, the shape of the base platform 140 is not limited to these shapes. For example, the base platform 140 may have a shape defined by two prisms crossing each other at a central part (cross shape), as illustrated in FIG. 16. Even if the shape of the base platform 140 is as described above, the regulating component 125 inserted into the through hole 142 of the base platform 140 can regulate the movement of the LED module 130. More specifically, it is possible to prevent the lead wire 170 from being disconnected from the LED module 130 by vibration or others.

Embodiment 4

Next, the light bulb shaped lamp 100 according to the embodiment 4 of the present invention shall be described.

In the light bulb shaped lamp according to the embodiment 4, the lead wire regulates the movement of the LED module with respect to the stem. Note that, in the following embodiment, illustration and description for the components identical to the components in the light bulb shaped lamp according to the embodiment 1 shall be omitted where appropriate.

(Overall Configuration of Light Bulb Shaped Lamp 100)

Figure 17:
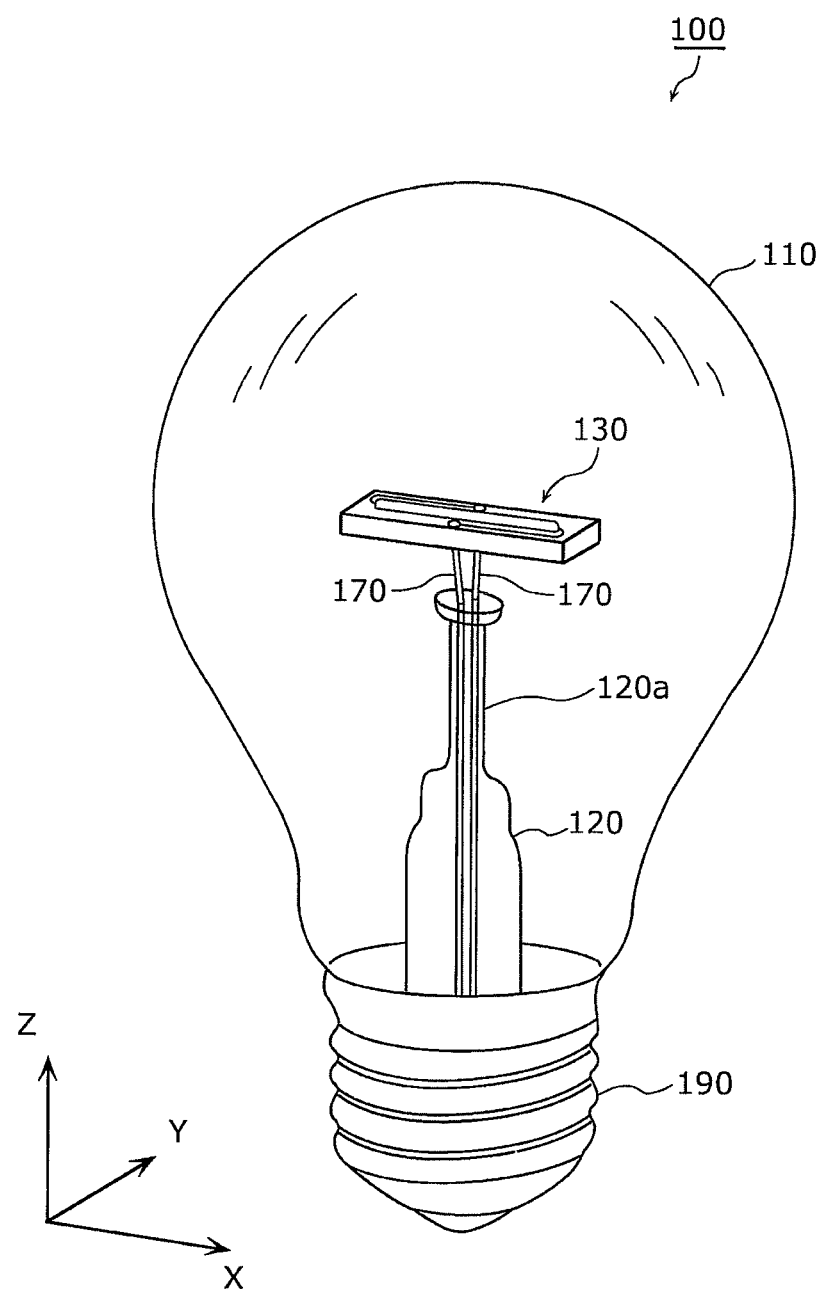
FIG. 17 is a perspective view of a light bulb shaped lamp according to the embodiment 4 of the present invention.
Figure 18:
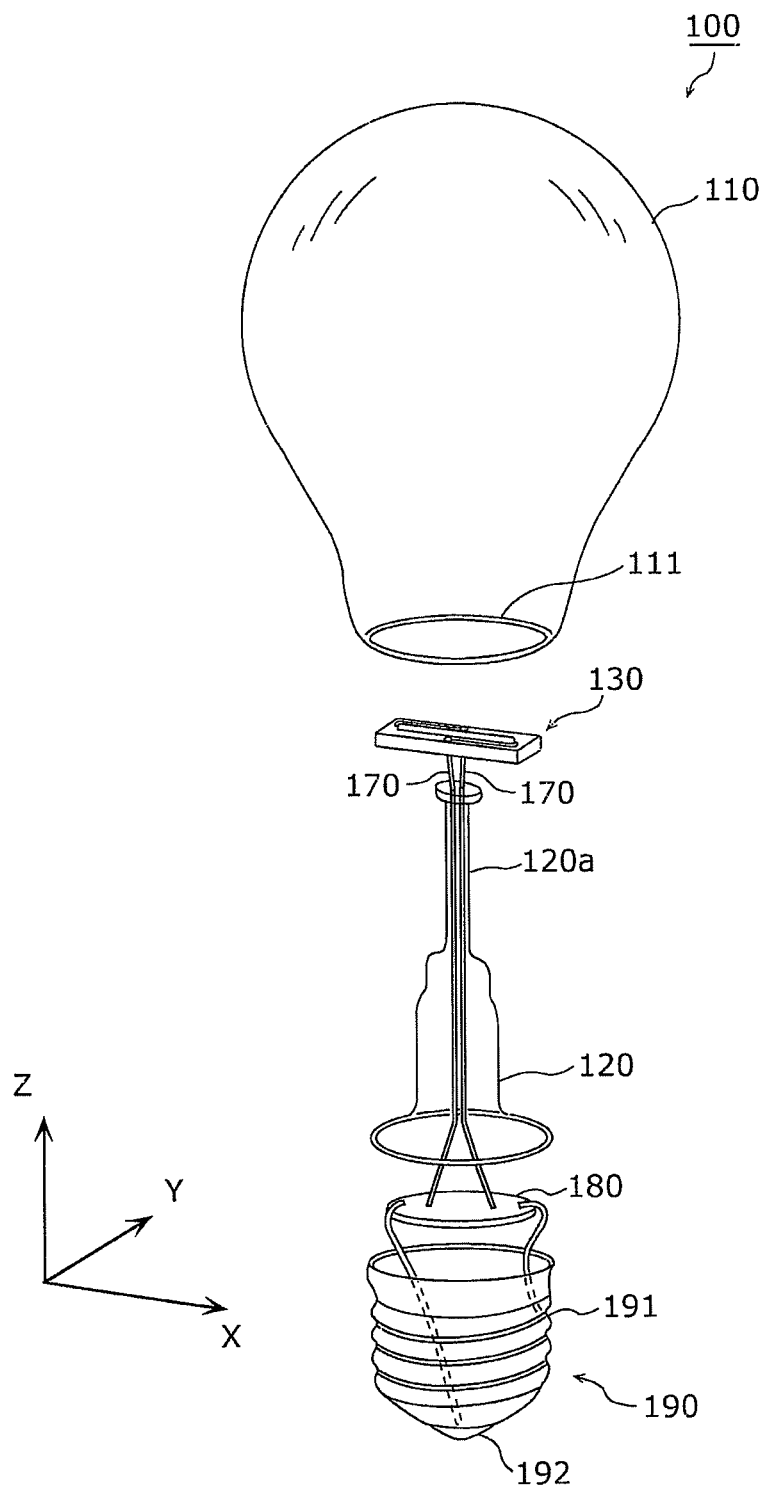
FIG. 18 is an exploded perspective view of the light bulb shaped lamp according to the embodiment 4 of the present invention.
Figure 19:
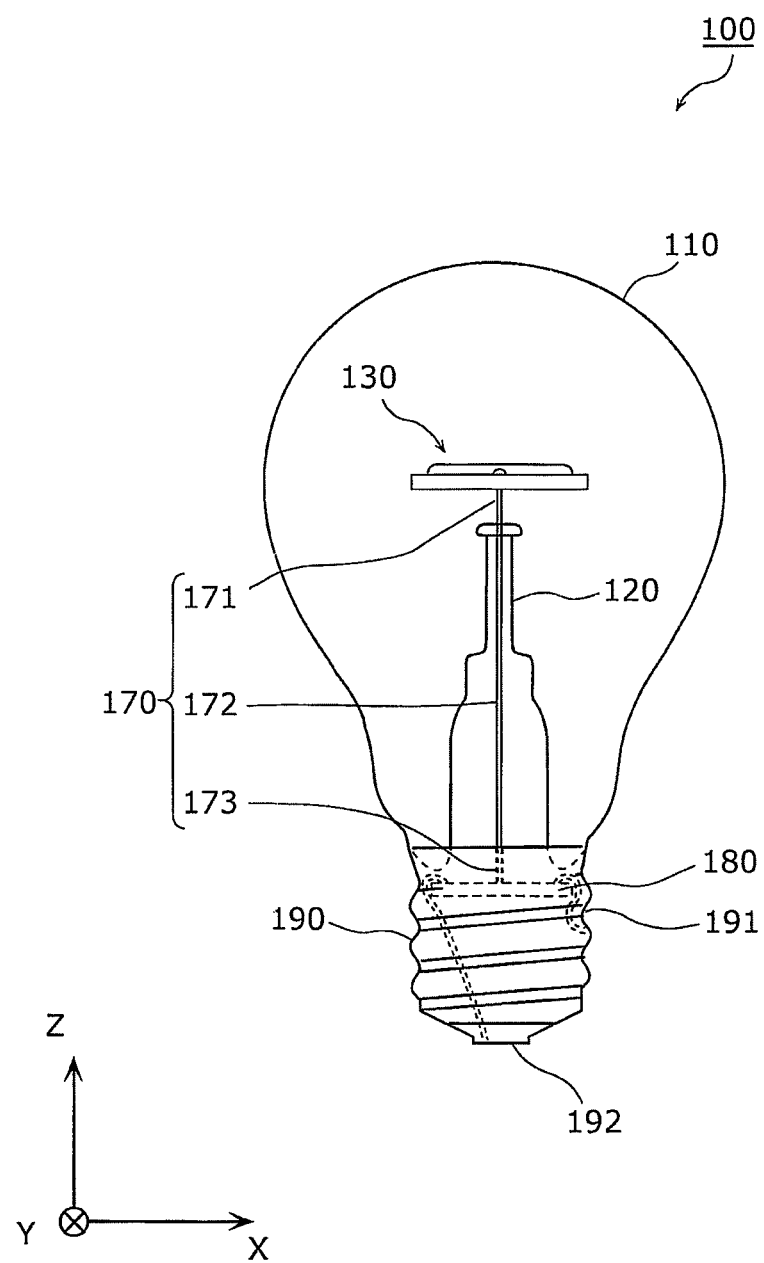
FIG. 19 is a front view of a light bulb shaped lamp according to the embodiment 4 of the present invention.

FIG. 17 is a cross-sectional view of the light bulb shaped lamp 100 according to the embodiment 4 of the present invention. FIG. 18 is an exploded perspective view of the light bulb shaped lamp 100 according to the variation of the embodiment 4 of the present invention. FIG. 19 is a front view of the light bulb shaped lamp 100 according to the embodiment 4 of the present invention. Note that, in FIG. 19, part of the lighting circuit 180 and the lead wire 170 inside the base 190 is shown in dotted lines.

The light bulb shaped lamp 100 is a light bulb including the translucent globe 110 and the base 190 attached t the globe 110. The LED module 130 on which the LED chips are mounted is housed in the LED module 130. The lead wires 170 extending from the end of the stem 120 supports the LED module 130.

More specifically, as illustrated in FIG. 17 to FIG. 19, the light bulb shaped lamp 100 includes the globe 110, the stem 120, the LED module 130, the two lead wires 170, the lighting circuit 180, and the base 190.

(Stem 120)

The stem 120 is provided extending from the opening 111 of the globe 110 toward the inside of the globe 110. More specifically, a rod-shaped extending portion 120a extending in the Z-axis direction up to the vicinity of the LED module 130 is formed at an end of the stem 120. The lead wire 170 is projecting from the tip of the extending portion 120a. Stated differently, the lead wire 170 is fixed to the end of the stem 120.

(LED Module 130)

Figure 20:
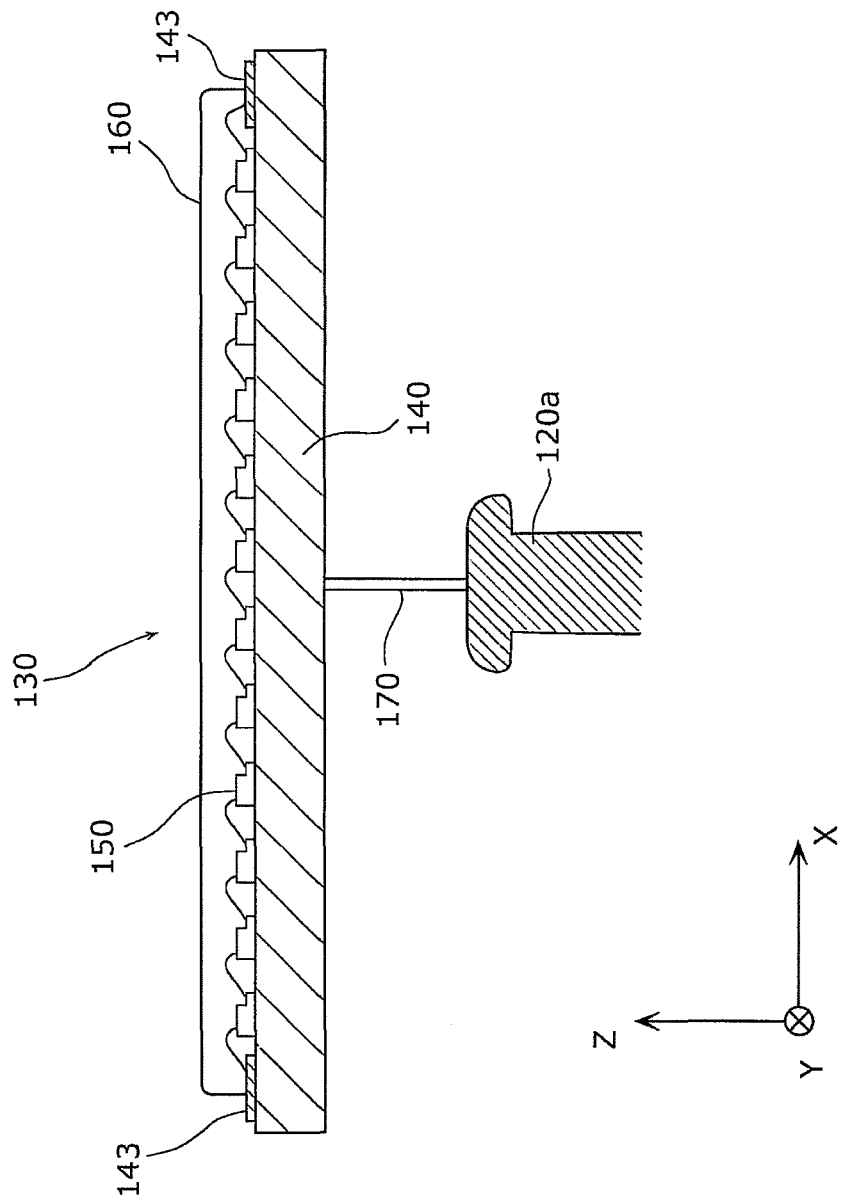
FIG. 20 is a cross-sectional view of components around the LED module according to the embodiment 4 of the present invention in the Y-axis direction.
Figure 21:
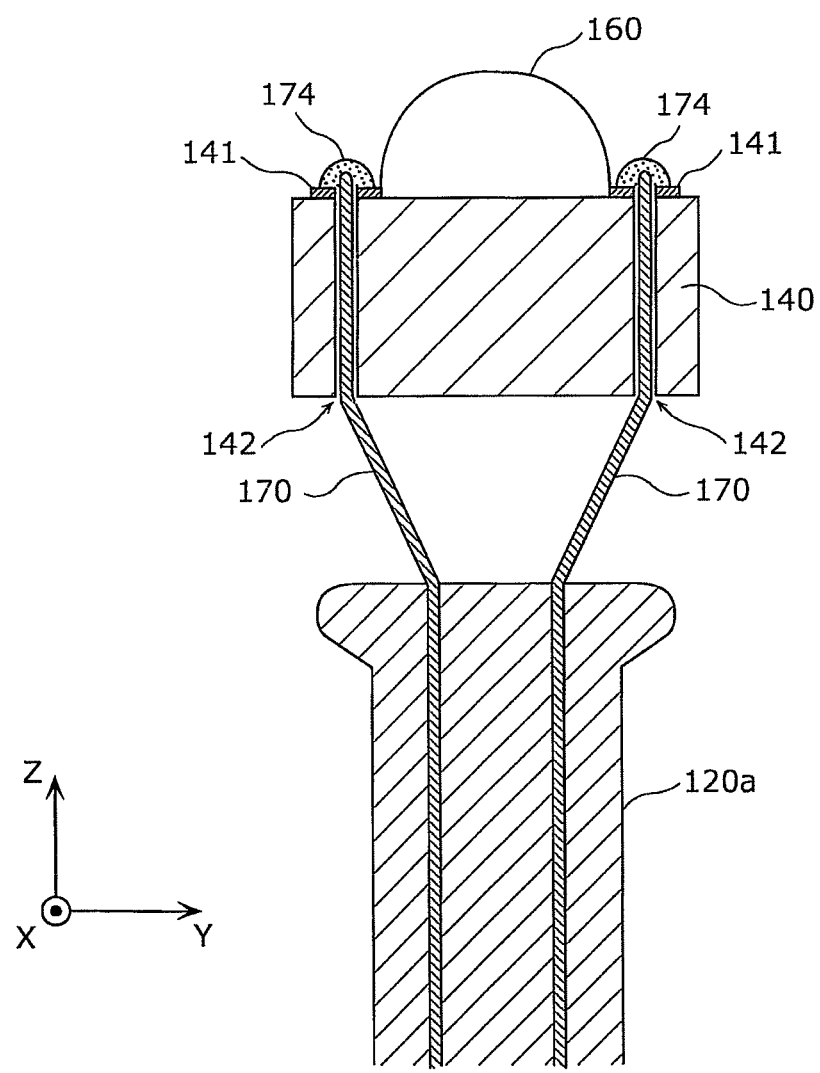
FIG. 21 is a cross-sectional view of components around the LED module according to the embodiment 4 of the present invention in the X-axis direction.
Figure 22:
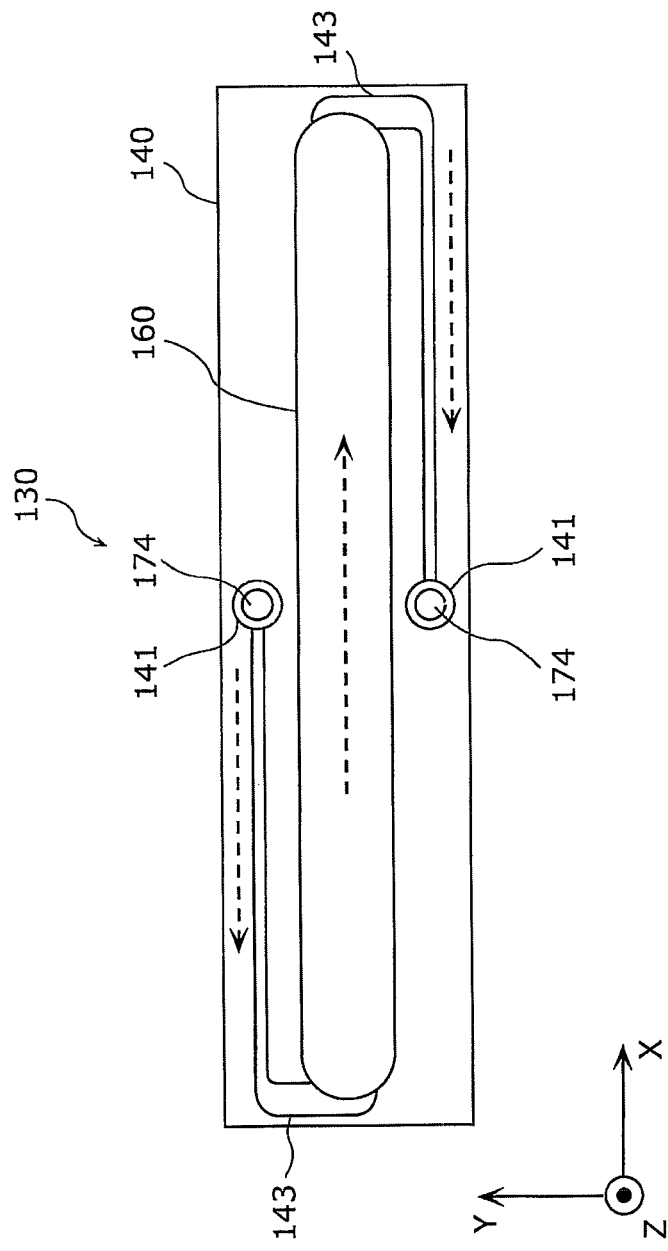
FIG. 22 is a plan view of the LED module according to the embodiment 4 of the present invention.

FIG. 20 is a cross-sectional view of the components around the LED module 130 according to the embodiment 4 of the present invention in the Y-axis direction. FIG. 21 is a cross-sectional view of the components around the LED module 130 according to the embodiment 4 of the present invention in the X-axis direction. FIG. 22 is a plan view of the LED module 130 according to the embodiment 4 of the present invention.

The LED module 130 corresponds to the first light-emitting module, and is housed in the globe 110. It is preferable that the LED module 130 is arranged at a center of the spherical shape defined by the globe 110 (for example, inside the large-diameter part with a large diameter in the globe 110). Since the LED module 130 is arranged at the center as described above, the light bulb-shaped LED lamp 100 can achieve omnidirectional light distribution property approximated to that of a general incandescent lamp using a conventional filament coil.

As illustrated in FIG. 20 and FIG. 21, the LED module 130 includes the base platform 140, the plurality of LED chips 150, and the sealing material 160. The LED module 130 is arranged such that the surface on which the LED chips 150 are mounted faces the top of the globe 110 (toward the positive direction in the Z-axis direction).

(Base Platform 140)

The base platform 140 corresponds to the first base platform, and a component translucent to visible light. More specifically, the base platform 140 is a ceramic component containing alumina. The base platform 140 has two through holes 142 passing through the base platform 140 in the Z-axis direction. In the embodiment 4, two through holes 142 are arranged interposing one row of LED chips 150 mounted in between. One of or the other one of the two lead wires 170 guided from the end of the stem 120 is inserted into each of the two through holes 142. The tip of the lead wire 170 inserted into the through hole 142 is physically and electrically connected to the power supply terminal 141 provided around the through hole 142 by the joining material 174 such as solder.

On the surface of the base platform 140 on which the LED chip 150 is mounted, the metal line pattern 143 connecting the power supply terminal 141 and the end portion of the base platform 140 in the longer direction (X-axis direction). Stated differently, the LED chips 150 are electrically connected to the two lead wires 170 inserted into the through holes 142 through the metal line pattern 143 and the power supply terminals 141. As a result, the current flows in the direction illustrated in the arrows in FIG. 22 when the light bulb shaped lamp 100 is turned on.

The shape of the base platform 140 is a quadrangular prism (20 mm in length (X-axis direction), 1.5 mm in width (Y-axis direction), and 0.8 mm in thickness (Z-axis direction)). Since the base platform 140 has the shape of quadrangular prism, the light bulb shaped lamp 100 is capable of reproducing the filament of an incandescent light bulb, using the LED module 130. Note that, the shape and size of the base platform 140 are examples, and may be in other shape or size.

(LED Chip 150)

The LED chip 150 is a semiconductor light-emitting device and emits blue light when energized in the embodiment 4. The LED chips 150 are mounted on one side of the base platform 140. More specifically, 12 LED chips 150 are mounted in a straight line in the longer direction of the base platform 140.

(Lead Wire 170)

The two lead wires 170 protrude from the end of the extending portion 120a of the stem 120, and support the LED module 130. Stated differently, the two lead wires 170 holds the LED module 130 at a constant position in the globe 110. The power supplied from the base 190 is supplied to the LED chips 150 through the two lead wires 170. Each of the lead wire 170 is a composite wire including an internal lead wire 171, a Dumet wire (copper-clad nickel steel wire) 172 and an external lead wire 173 joined in this order, and has a strength sufficient to support the LED module 130.

The internal lead wire 171 extends from the end of the stem 120 toward the LED module 130. The end of the internal lead wire 171 is inserted into the through hole 142 formed in the base platform 140, and is joined with the base platform 140 by the joining material 174 such as solder.

The Dumet wire 172 is sealed in the stem 120. The external lead wire 173 extends from the lighting circuit 180 toward the stem 120.

As described above, according to the light bulb shaped lamp 100 in the embodiment 4, the LED module 130 can be supported by the lead wire 170 projecting from the tip of the stem 120 extended to the vicinity of the LED module 130. Stated differently, it is possible to make the length of the lead wire 170 exposed from the stem 120 relatively short, increasing the strength of the lead wire 170. With the configuration, it is possible to reduce the possibility of the lead wire 170 being disconnected from the LED module 130 when the light bulb shaped lamp 100 is shaken, for example. Furthermore, the base 190 is provided at the opening 111 in the globe 110 housing the LED module 130 inside. Accordingly, it is possible to achieve the light distribution characteristics equivalent or similar to that of a conventional incandescent light bulb, without the light generated at the LED chip 150 being blocked by the case.

The following shall describe a variation of the light bulb shaped lamp 100 according to the variation of the embodiment 4 of the present invention.

Variation 1 of Embodiment 4

First, the variation 1 of the embodiment 4 according to the present invention shall be described.

The light bulb shaped lamp according to the variation 1 of the embodiment 4 is different from the light bulb shaped lamp according to the embodiment 4 mostly in the shape of the lead wire 170. The following shall describe the light bulb shaped lamp according to the variation with reference to the drawings. Note that, in the following embodiment, illustration and description for the components identical to the components in the light bulb shaped lamp according to the embodiment 4 shall be omitted where appropriate.

Figure 23:
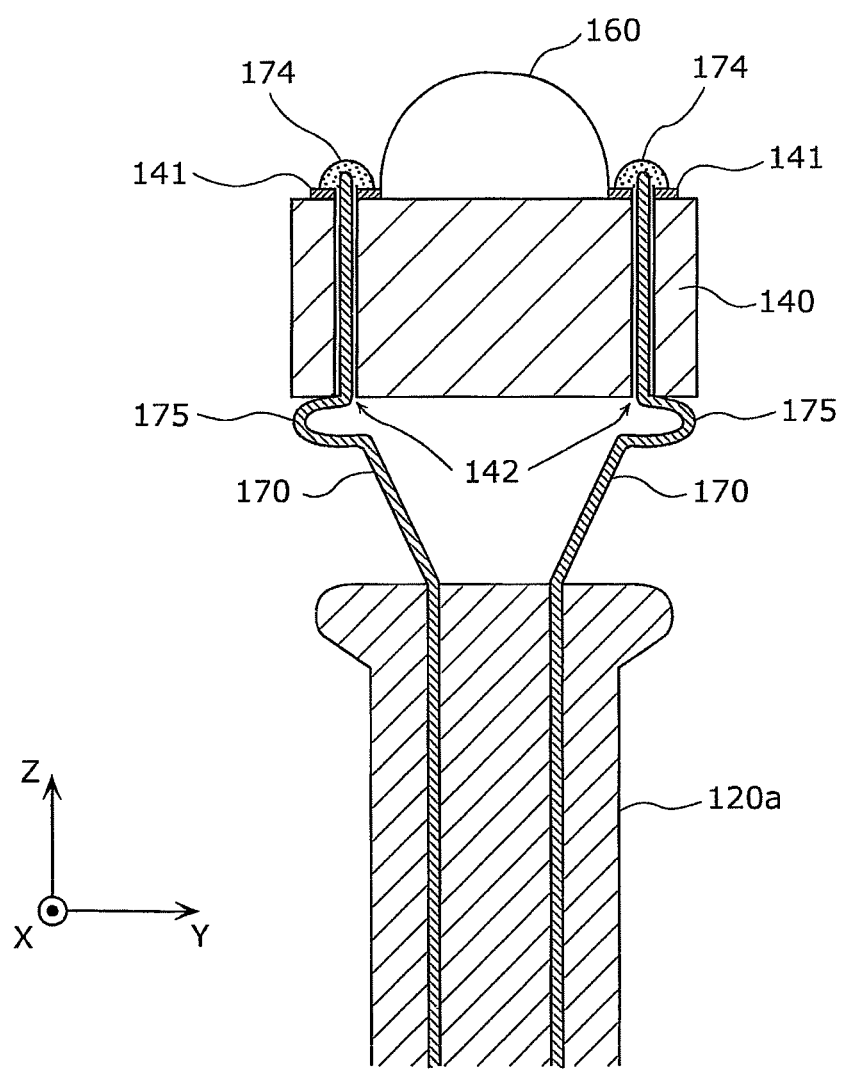
FIG. 23 is a cross-sectional view of components around the LED module according to the variation 1 of the embodiment 4 of the present invention in the X-axis direction.

FIG. 23 is a cross-sectional view of the components around the LED module 130 according to the variation 1 of the embodiment 4 of the present invention in the X-axis direction.

As illustrated in FIG. 23, the lead wire 170 in the light bulb shaped lamp 100 according to the variation includes a supporting part 175 supporting the base platform 140 from the side of the stem 120. The supporting part 175 is the bent part of the lead wire 170, and is formed between the stem 120 and the base platform 140. In the embodiment 4, the bent part is U-shaped.

As described above, according to the light bulb shaped lamp 100 according to the variation, the supporting part 175 formed in U-shape is provided in the lead wire 170. Accordingly, it is possible to regulate the movement of the base platform 140 toward the stem 120 (toward the negative direction in the Z-axis direction) by a simple structure. Furthermore, the supporting part 175 formed in U-shape has elasticity in the Z-axis direction. Accordingly, it is possible to absorb the vibration in the Z-axis direction. With the configuration, it is possible to reduce the possibility of the lead wire 170 being disconnected from the LED module 130 when the light bulb shaped lamp 100 is shaken, for example.

Note that, it is not necessary for the supporting part 175 to be in U-shape. The supporting part 175 may be in a square U-shape or coil shape. Furthermore, the supporting part 175 may be a component larger than the through hole 142 (for example, the board component). Stated differently, the supporting part 175 may be in any shape as long as the movement of the base platform 140 toward the stem 120 along the lead wire 170.

Variation 2 of Embodiment 4

First, the variation 2 of the embodiment 4 according to the present invention shall be described.

The light bulb shaped lamp 100 according to the variation 2 of the embodiment 4 is different from the light bulb shaped lamp according to the embodiment 4 mostly in the way that the LED chips 150 are mounted. The following shall describe the light bulb shaped lamp according to the variation with reference to the drawings. Note that, in the following embodiment, illustration and description for the components identical to the components in the light bulb shaped lamp according to the embodiment 4 shall be omitted where appropriate.

Figure 24:
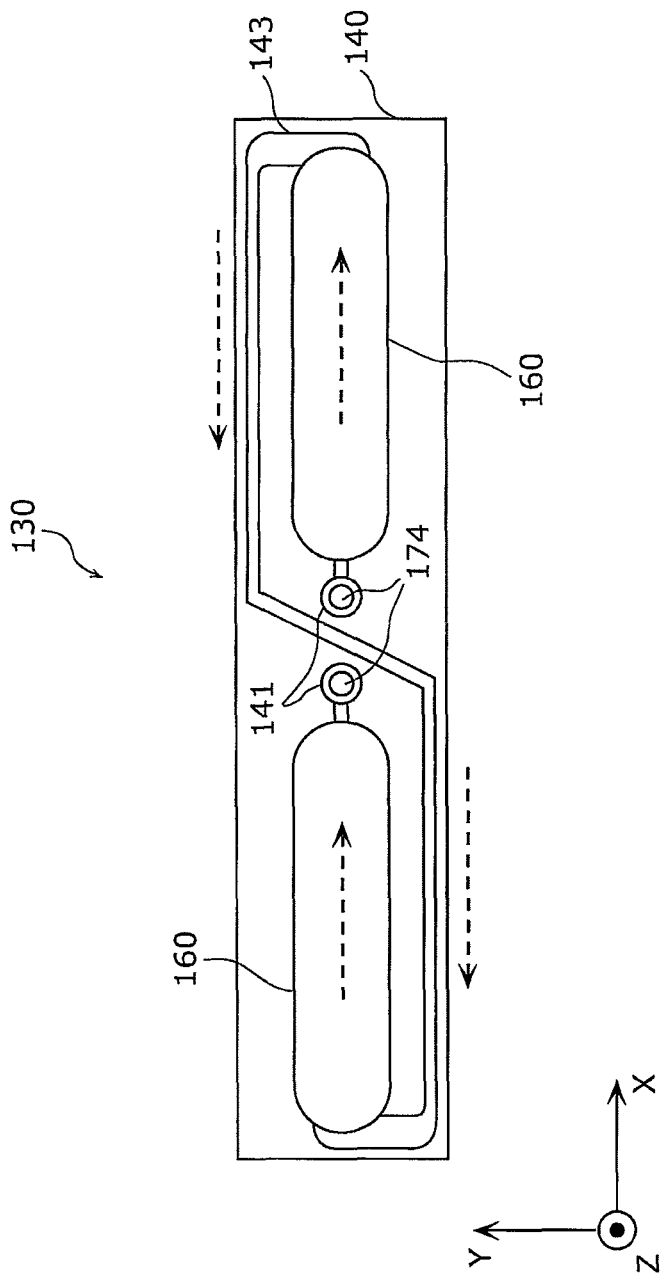
FIG. 24 is a plan view of the LED module according to the variation 2 of the embodiment 4 of the present invention.

FIG. 24 is a plan view of the components around the LED module 130 according to the variation 2 of the embodiment 4 of the present invention.

In the variation, the LED chips 150 are mounted on the base platform 140 in two LED-chip rows. Each of the LED chip rows is mounted in the longer direction of the base platform 140 in a straight line. One end of each of the LED ship rows is connected to the lead wire 170 inserted into the through hole 142 through the metal line pattern 143. The other ends of each of the LED chip rows are connected to each other through the metal line pattern 143. As a result, the current flows in the direction illustrated in the arrows in FIG. 24 when the light bulb shaped lamp 100 is turned on.

Variation 3 of Embodiment 4

First, the variation 3 of the embodiment 4 according to the present invention shall be described.

The light bulb shaped lamp 100 according to the variation 3 of the embodiment 4 of the present invention is different from the light bulb shaped lamp according to the embodiment 4 in that a supporting wire 1250 is included. The following shall describe the light bulb shaped lamp according to the variation with reference to the drawings. Note that, in the following embodiment, illustration and description for the components identical to the components in the light bulb shaped lamp according to the embodiment 4 shall be omitted where appropriate.

Figure 25:
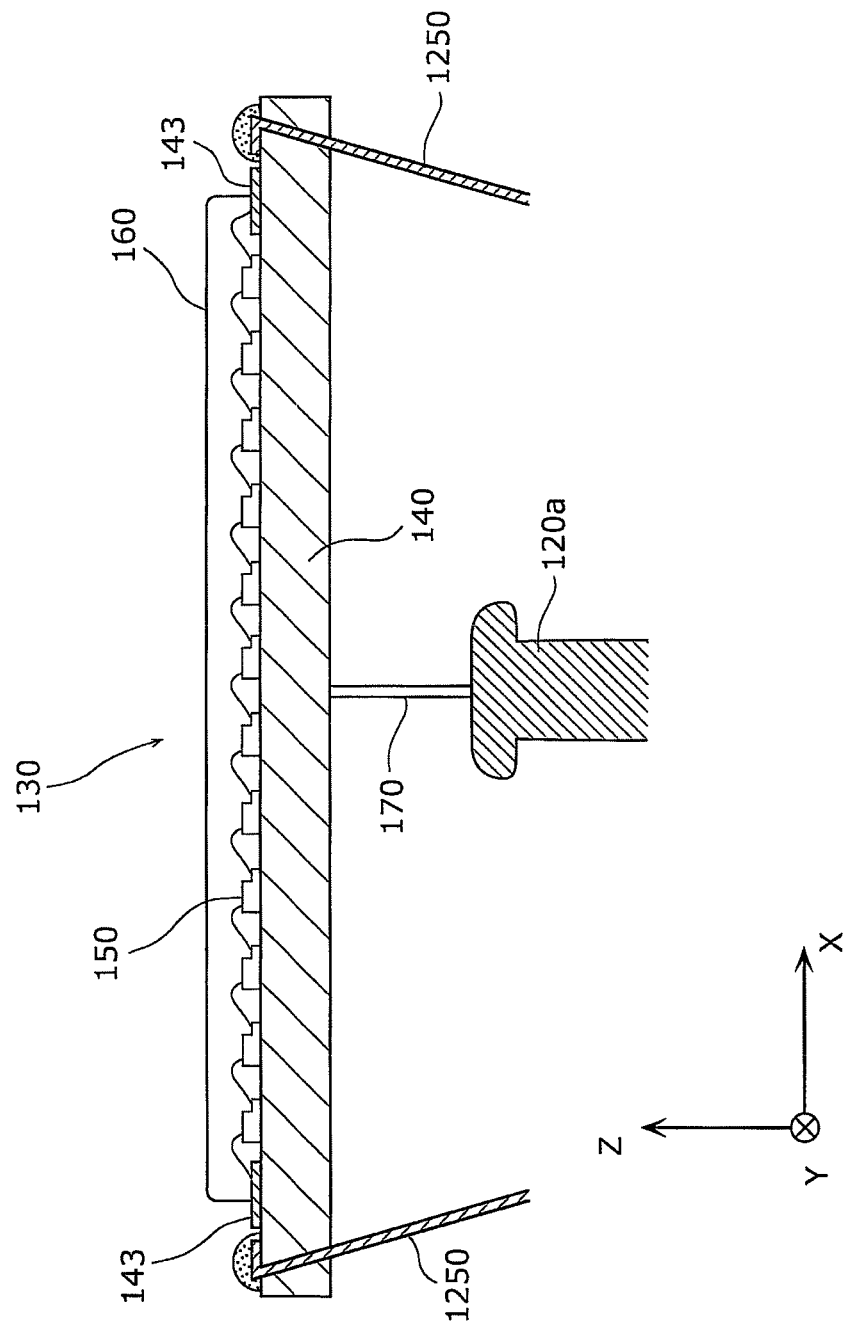
FIG. 25 is a cross-sectional view of components around the LED module according to the variation 3 of the embodiment 4 of the present invention.

FIG. 25 is a cross-sectional view of the components around the LED module according to the variation 3 of the embodiment 4 of the present invention in the Y-axis direction. As illustrated in FIG. 25, the light bulb shaped lamp 100 according to the variation further includes two supporting wires 1250.

Each of the two supporting wires 1250 is fixed to the stem 120, and supports a peripheral portion of the base platform 140. More specifically, the supporting wire 1250 is inserted into the through hole in the base platform 140. The end portion of the supporting wire 1250 projecting from the through hole is bent into L-shape, and fixed to the base platform 140 by an adhesive material or others.

Note that, it is not necessary for the supporting wire 1250 to be electrically connected to the LED module 130.

As described above, according to the light bulb shaped lamp 100 according to the variation, the peripheral portion of the base platform 140 can be supported by the supporting wire 1250. Accordingly, it is possible to more securely reduce the possibility that the lead wire 170 from being disconnected from the LED module 130 by vibration or others.

Embodiment 5

The following shall describe a variation of the light bulb shaped lamp 100 according to the embodiment 5 of the present invention.

The light bulb shaped lamp according to the embodiment 5 is different from the light bulb shaped lamp according to the embodiment 4 in that two LED modules are included. The following shall describe the light bulb shaped lamp according to the embodiment with reference to the drawings. Note that, in the following embodiment, illustration and description for the components identical to the components in the light bulb shaped lamp according to the embodiment 4 shall be omitted where appropriate.

Figure 26:
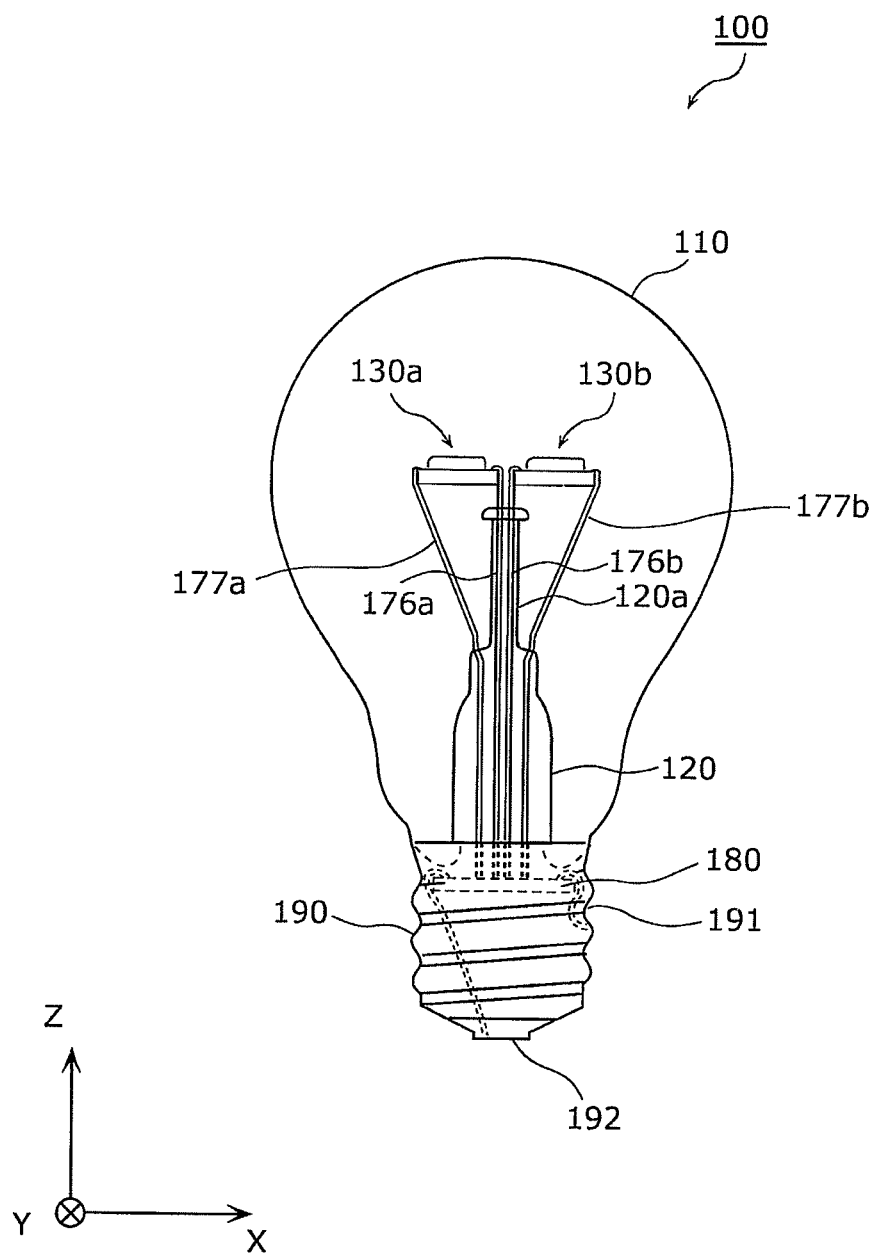
FIG. 26 is a front view of a light bulb shaped lamp according to the embodiment 5 of the present invention.
Figure 27:
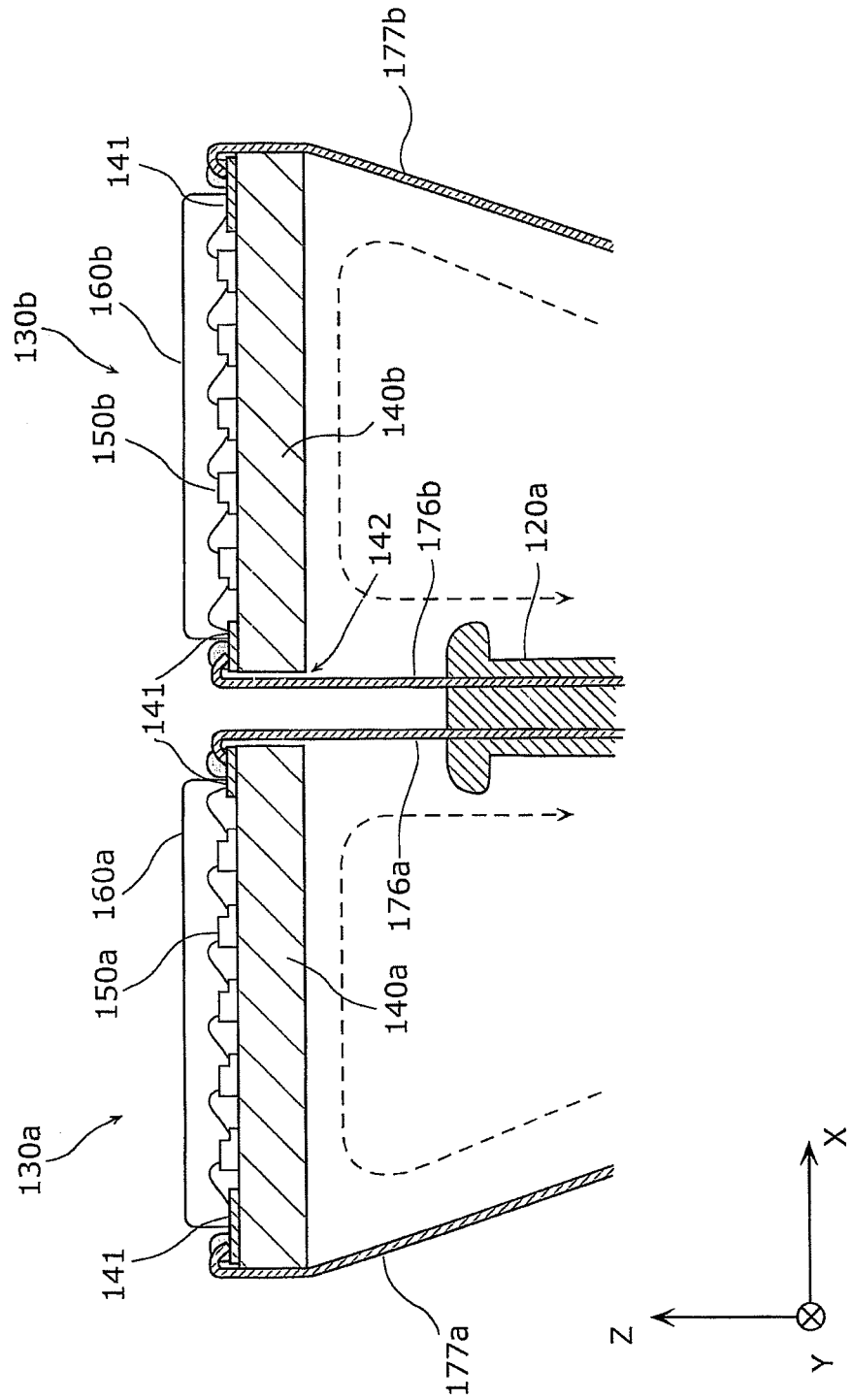
FIG. 27 is a cross-sectional view of components around the LED module according to the embodiment 5 of the present invention in the Y-axis direction.

FIG. 26 is a front view of the light bulb shaped lamp 100 according to the embodiment 5 of the present invention. FIG. 27 is a cross-sectional view of the components around the LED module according to the embodiment 5 of the present invention in the Y-axis direction.

The light bulb shaped lamp 100 according to the embodiment includes two LED modules (the first LED module 130a and the second LED module 130b); two first lead wires 176a and 176b, and two second lead wires 177a and 177b.

As illustrated in FIG. 27, the first LED module 130a includes a first base platform 140a, first LED chips 150a, and a first sealing material 160a. The first base platform 140a is supported by the first lead wire 176a and the second lead wire 177a. The power is supplied to the first LED chip 150a through the first lead wire 176a and the second lead wire 177a.

The second LED module 130b includes a second base platform 140b, second LED chips 150b, and the second sealing material 160b. The second base platform 140b is supported by the first lead wire 176b and the second lead wire 177b. The power is supplied to the second LED chip 150b through the first lead wire 176b and the second lead wire 177b.

Note that, since the configuration of the first LED module 130a and the second LED module 130b is identical, the first LED module 130a shall be described in the following description, and the description for the second LED module 130b shall be omitted.

The first base platform 140a is a component translucent to visible light, as the base platform 140 according to the embodiment 4, and is a ceramic component containing alumina. The shape of the first base platform is a quadrangular prism.

The power supply terminal 141 is provided in each end of the base platform 140a in the longer direction (X-axis direction). Each of the first lead wire 176a and the second lead wire 177a is electrically and physically connected to the power supply terminal 141 by solder.

The first LED chip 150a emits blue light when energized, in the same manner as the LED chip 150 according to the embodiment 4. In this embodiment, five first LED chips 150a are mounted in a straight line between the two power supply terminals 141.

Note that, the structure of the first LED chips 150a are identical to the structure illustrated in the embodiment 4. Accordingly, the detailed description shall be omitted. The first sealing material 160a is identical to the sealing material 160 according to the embodiment 4. Accordingly, the detailed description shall be omitted.

Part of the first lead wires 176a and 176b are sealed in the stem 120, and projects from the tip of the stem 120. Part of the second lead wires 177a and 177b are sealed in the stem 120, and projects from an intermediate part of the stem 120.

As described above, according to the light bulb shaped lamp 100 according to the embodiment, the first lead wires 176a and 176b can achieve both the power supply to the two LED modules and the support of the two LED modules. Accordingly, when the light bulb shaped lamp 100 includes two LED modules, it is possible to reduce the possibility that the lead wire is disconnected from the two LED modules by a relatively simple structure.

Furthermore, according to the light bulb shaped lamp 100 according to the embodiment 5, power can be supplied to the two LED modules separately through different lead wires. Accordingly, it is possible to turn on only one of the two LED modules, for example.

Variation of Embodiment 5

The following shall describe a variation of the light bulb shaped lamp according to the variation of the embodiment 5 of the present invention.

The light bulb shaped lamp according to the variation is different from the light bulb shaped lamp according to the embodiment 5 mostly in the first lead wire. The following shall describe the light bulb shaped lamp according to the variation with reference to the drawings. Note that, in the following embodiment, illustration and description for the components identical to the components in the light bulb shaped lamp according to the embodiment 5 shall be omitted where appropriate.

Figure 28:
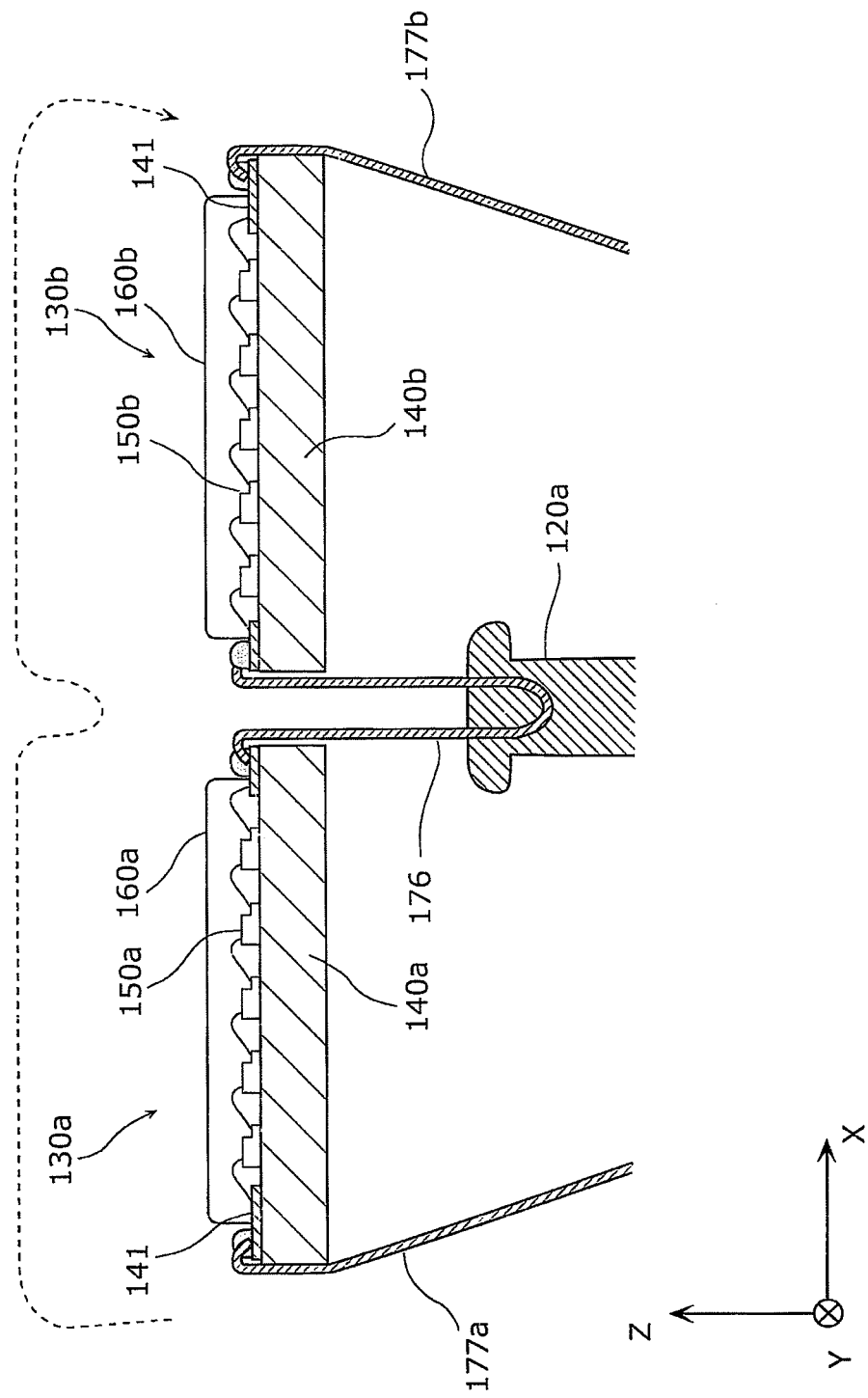
FIG. 28 is a cross-sectional view of components around the LED module according to the variation of the embodiment 5 of the present invention.

FIG. 28 is a cross-sectional view of the components around the LED module according to the variation of the embodiment 5 of the present invention in the Y-axis direction.

In the variation, one first lead wire 176 is included, and the first lead wire 176 electrically connects the first LED chip 150a and the second LED chip 150b in the globe 110. More specifically, one end of the first lead wire 176 is connected to the power supply terminal 141 provided on the first base platform 140a, and the other end of the first lead wire 176 is connected to the power supply terminal 141 provided on the second base platform 140b. Note that, the first lead wire 176 is U-shaped, and the bent part is fixed to the tip of the stem 120.

By electrically connecting the first LED chip 150a and the second LED chip 150b through the first lead wire 176, the current flows as illustrated in the arrows in FIG. 27 when the light bulb shaped lamp 100 is turned on.

As described above, according to the light bulb shaped lamp 100 according to the variation, the first lead wire 176 can achieve both the electrical connection between the two LED modules in the globe 110 and the support of two LED modules. Accordingly, when the light bulb shaped lamp 100 includes two LED modules, it is possible to reduce the possibility that the lead wire is disconnected from the two LED modules by a relatively simple structure.

Embodiment 6

Next, the embodiment 6 according to the present invention shall be described.

The light bulb shaped lamp according to the embodiment 6 is different from the light bulb shaped lamp according to the embodiment 4 or 5 mostly in the structure of the base platform 140. The following shall describe the light bulb shaped lamp according to the embodiment with reference to the drawings. Note that, in the following embodiment, illustration and description for the components identical to the components in the light bulb shaped lamp according to the embodiment 4 or 5 shall be omitted where appropriate.

Figure 29:
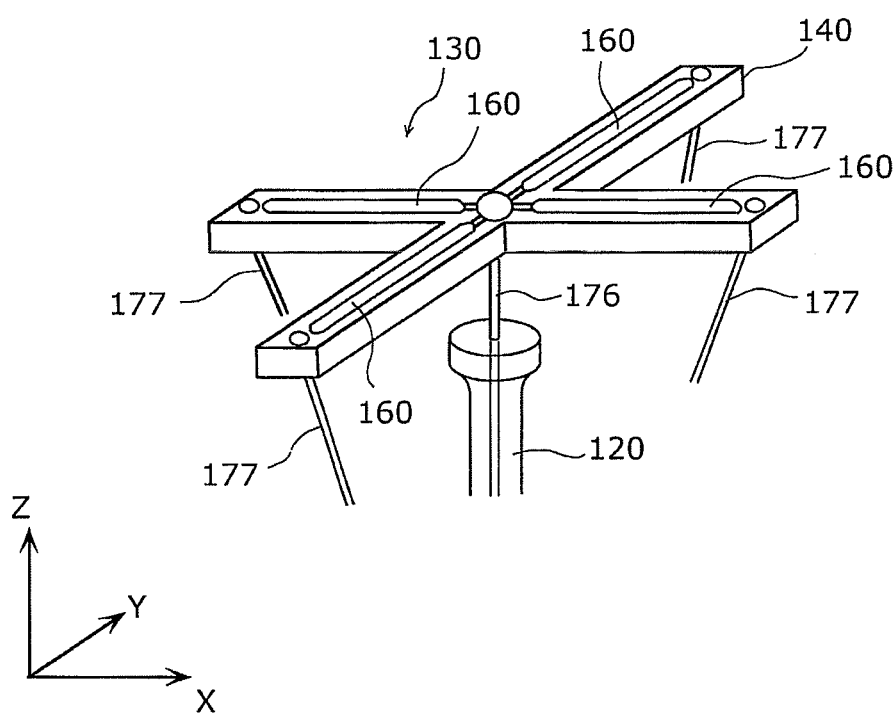
FIG. 29 is a perspective view of components around an LED module according to the embodiment 6 of the present invention.
Figure 30:
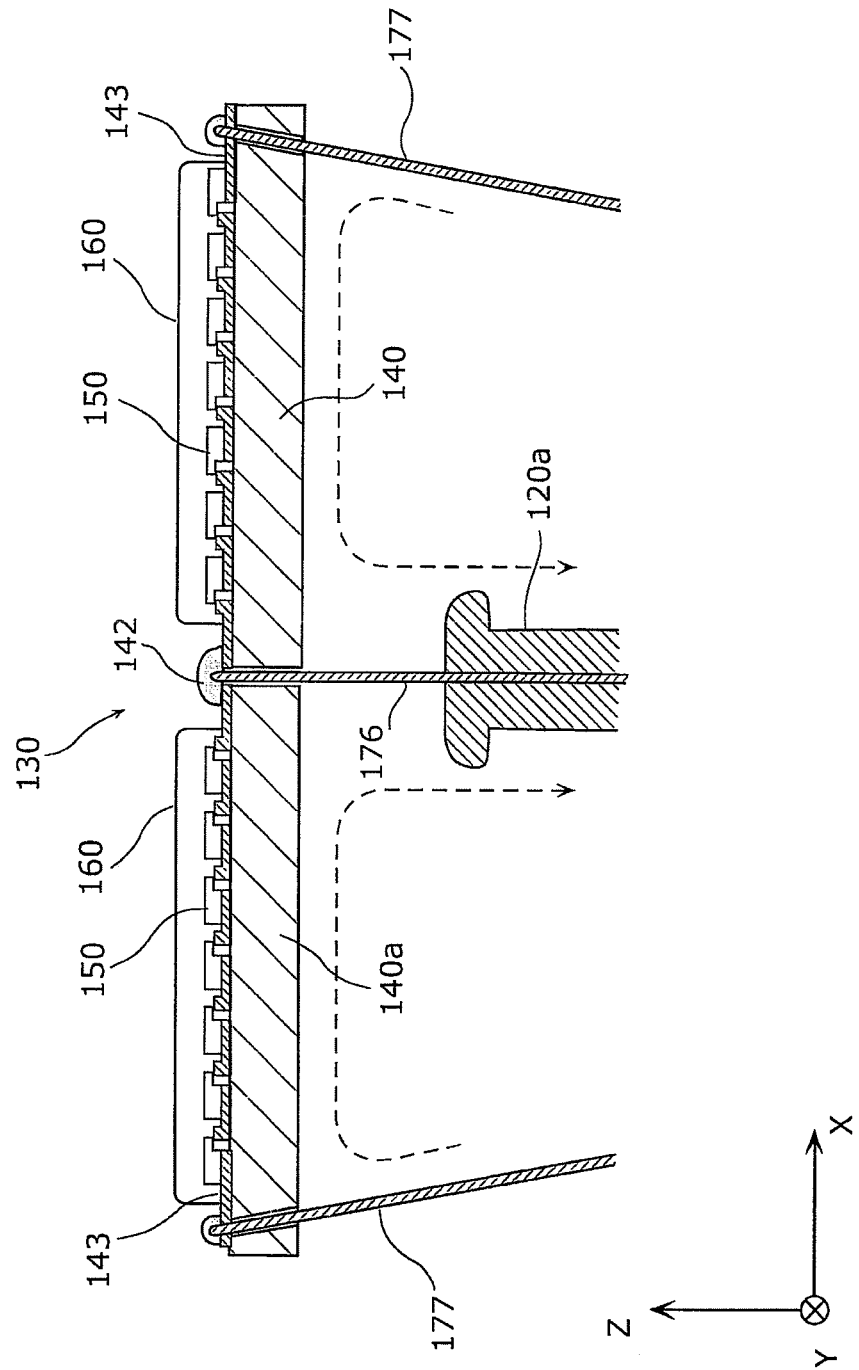
FIG. 30 is a cross-sectional view of components around the LED module according to the embodiment 6 of the present invention in the Y-axis direction.

FIG. 29 is a perspective view of the components around the LED module 130 according to the embodiment 6 of the present invention. FIG. 30 is a cross-sectional view of the components around the LED module 130 according to the embodiment 6 of the present invention in the Y-axis direction.

The base platform 140 is a ceramic translucent component containing aluminum nitride. The base platform 140 is a cross-shaped board component, and has through holes 142 at the center and each end. Each of the first lead wire 176 and four second lead wires 177 is inserted into the through holes 142.

Furthermore, as illustrated in FIG. 29, the metal line pattern 143 is formed on one side (surface) of the base platform 140, and the LED chips 150 are mounted thereon. The metal line pattern 143 is formed around each of the through holes 142, and the tip of each of the first lead wire 176 and the four second lead wires 177 is electrically and physically connected to the metal line pattern 143.

Stated differently, power is supplied to each of the LED chips 150 through the metal line pattern 143. Note that, the line pattern may be formed by a translucent conductive material such as indium tin oxide (ITO). In this case, compared to the metal line pattern, it is possible to suppress the loss of light generated by the LED chip 150 by the line pattern.

The LED chip 150 is a semiconductor light-emitting device which emits violet light when energized. More specifically, one row consists of seven LED chips 150 and 28 LED chips 150 in four rows are mounted in a cross-shape.

The sealing material 160 is a component having translucent property, and is provided so as to cover the rows of LED chips 150. The sealing material 160 contains blue phosphor, green phosphor, and red phosphor as wavelength conversion materials. As a result, the violet light emitted by the LED chip 150 is converted into white light.

Although only some exemplary embodiments of the light bulb shaped lamp according to an aspect of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

For example, in the embodiments 1 to 6, the light bulb shaped lamp 100 receives AC power from a commercial AC power source. However, the light bulb shaped lamp 100 may receive DC power from a battery or others. In this case, the light bulb shaped lamp 100 does not have to include the lighting circuit 180 illustrated in FIG. 6.

In the embodiments 1 to 6, the base platform 140 is prism-shaped or board shaped. However, the base platform 140 does not have to have these shapes.

Furthermore, not only the present invention can be implemented as a light bulb shaped lamp, but also as a lighting apparatus including the light bulb shaped lamp. The lighting apparatus according to an aspect of the present invention shall be described with reference to FIG. 31.

Figure 31:
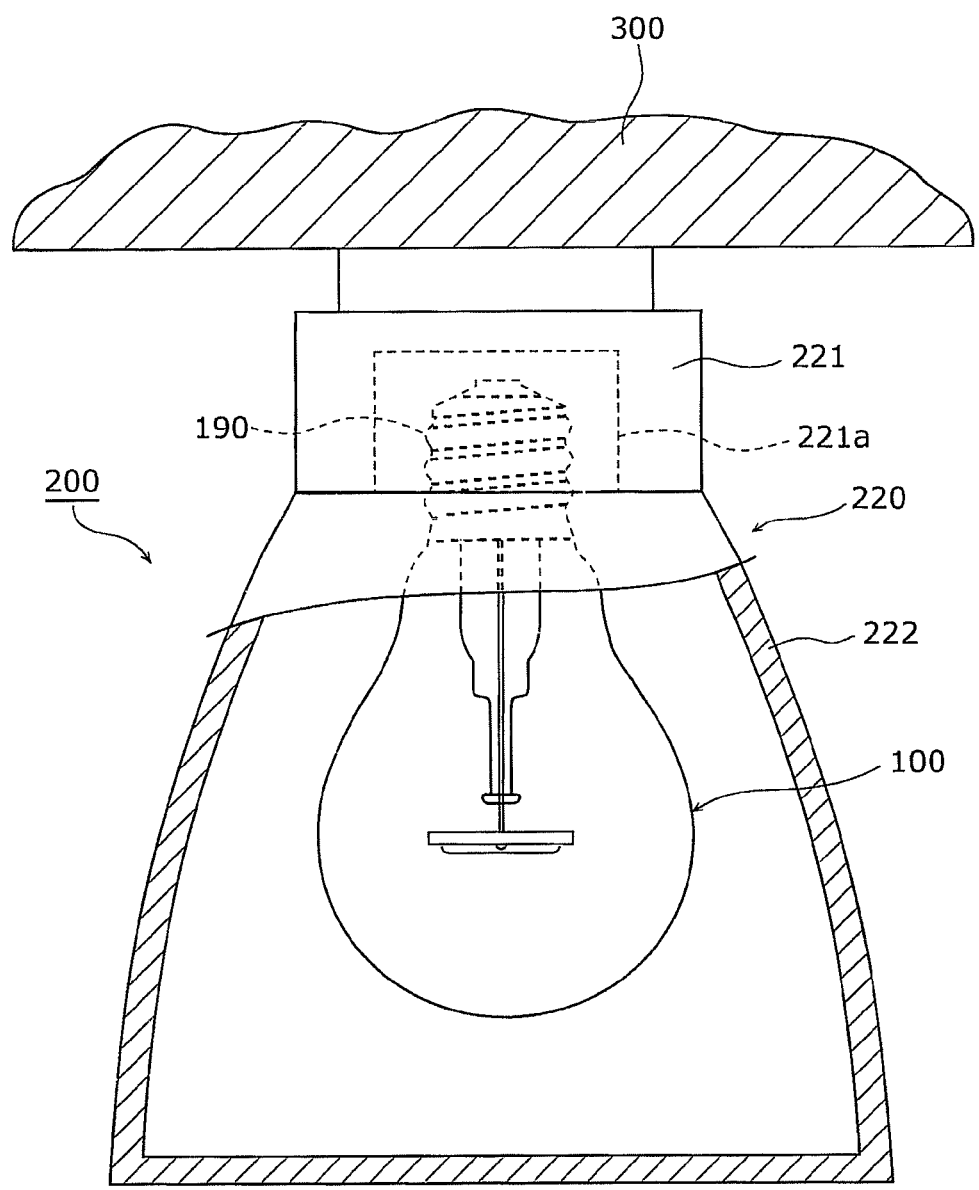
FIG. 31 is a schematic cross-sectional view of the lighting apparatus according to an aspect of the present invention.

FIG. 31 is a schematic cross-sectional view of the lighting apparatus 200 according to an aspect of the present invention.

The lighting apparatus 200 is attached to a ceiling 300 in a room when in use, and includes a light bulb shaped lamp 100 according to the embodiments 1 to 6 or the variations of the embodiments, and a lighting equipment 220, as illustrated in FIG. 31.

The lighting equipment 220 is for turning the light bulb shaped lamp 100 on and off, and includes an equipment body 221 attached to the ceiling 300 and a lamp cover 222 covering the light bulb shaped lamp 100.

The equipment body 221 includes a socket 221a. A base 190 of the light bulb shaped lamp 100 is screwed into the socket 221a. Power is supplied to the light bulb shaped lamp 100 through the socket 221a.

Note that, the lighting apparatus 200 illustrated here is an example of the lighting apparatus 200 according to an aspect of the present invention. The lighting apparatus according to an aspect of the present invention may include at least a socket for holding the light bulb shaped lamp 100 and supplying power to the light bulb shaped lamp 100. Note that, the base 190 does not have to be screwed into the socket, but may be simply plugged in.

Furthermore, although one light bulb shaped lamp 100 is included in the lighting apparatus 200 illustrated in FIG. 31, the lighting apparatus 200 may include more than one light bulb shaped lamp 100.

INDUSTRIAL APPLICABILITY

The present invention is useful as an LED light bulb replacing conventional incandescent light bulb or others, or as a lighting apparatus including the LED light bulb.

REFERENCE SIGNS LIST

100 Light bulb shaped lamp
110 Globe
111 Opening
120 Stem
120a Extending portion
121 Board component
122 Adhesive material
123 Cutout
124, 142 Through hole
125 Regulating component
126 Supporting part
127 End portion
128 Joining material
129 Rivet
130 LED module
130a First LED module
130b Second LED module
140 Base platform
140a First base platform
140b Second base platform
141 Power supply terminal
143 Metal line pattern
150 LED chip
150a First LED chip
150b Second LED chip
151 Sapphire board
152 Nitride semiconductor layer
153 Cathode
154 Anode
155, 156 Wire bonding portion
157 Gold wire
158 Chip bonding material
160 Sealing material
160a First sealing material
160b Second sealing material
170 Lead wire
171 Internal lead wire
172 Dumet wire
173 External lead wire
174 Joining material
175 Supporting part
176, 176a, 176b First lead wire
177, 177a, 177b Second lead wire
180 Lighting circuit
181 Input terminal
182 Output terminal
183 Diode bridge
184 Capacitor
185 Resistor
190 Base
191 Screw
192 Eyelet
200 Lighting apparatus
220 Lighting equipment
221 Equipment body
221a Socket
222 Lamp cover
300 Ceiling
1250 Supporting wire

The invention claimed is:

1. A light bulb shaped lamp comprising:
a hollow globe having an opening;
a first light-emitting module having a first base platform and a first semiconductor light-emitting device mounted on the first base platform, the first light-emitting module being housed in the globe;
a stem extending from the opening of the globe to the vicinity of the first light-emitting module and having, on a side closer to the opening of the globe, a large diameter part with a diameter larger than a diameter at a part in the vicinity of the first light-emitting module;
a lead wire projecting from the large diameter part of the stem toward the interior of the globe, the lead wire being for supplying the first light-emitting module with power; and
a regulating component which is fixed to an end of the stem and which regulates movement of the first light-emitting module with respect to the stem.

2. The light bulb shaped lamp according to claim 1, wherein the first base platform has a through hole, and the regulating component is inserted in the through hole.

3. The light bulb shaped lamp according to claim 2, further comprising
a plurality of the regulating components,
wherein the first base platform has a plurality of the through-holes each corresponding to one of the regulating components, and
axial directions of at least two of the through holes are different from each other.

4. The light bulb shaped lamp according to claim 3, wherein the stem is bonded to the globe so as to close the opening of the globe, and
a part of the regulating component is sealed to the stem.

5. The light bulb shaped lamp according to claim 2, wherein an end portion of the regulating component projecting from the through hole is bent.

6. The light bulb shaped lamp according to claim 2, wherein an end portion of the regulating component inserted in the through hole is fixed to the first base platform by a joining material.

7. The light bulb shaped lamp according to claim 2, wherein the regulating component has a supporting part which supports the first base platform from a side closer to the stem.

8. The light bulb shaped lamp according to claim 7, wherein the supporting part has a width larger than the width of the through hole, and is provided between the end of the stem and the first base platform.

9. The light bulb shaped lamp according to claim 7, wherein the regulating component is a linear component, and
the supporting part is a bent part of the regulating component, and is formed between the end of the stem and the first base platform.

10. The light bulb shaped lamp according to claim 9, wherein the bent part is U-shaped.

11. The light bulb shaped lamp according to claim 1, wherein the stem is bonded to the globe so as to close the opening of the globe, and
a part of a first lead wire is sealed in the stein.

12. The light bulb shaped lamp according to claim 1, further comprising:
a second light-emitting module having a second base platform and a second semiconductor light-emitting device mounted on the second base platform, the second light-emitting module being housed in the globe; and at least two second lead wires supporting the first light-emitting module and the second light-emitting module, the at least two second lead wires being for supplying the first light-emitting module and the second light-emitting module with power,
wherein the first lead wire supports the first base platform and the second base platform, and
one of the two second lead wires supports the first base platform and the other of the two second lead wires supports the second base platform.

13. The light bulb shaped lamp according to claim 12, further comprising
at least two of the first lead wires,
wherein one of the two first lead wires supports the first base platform, and the other of the two first lead wires supports the second base platform,
the first light-emitting module is supplied with power through the one of the two first lead wires and the one of the two second lead wires, and
the second light-emitting module is supplied with power through the other of the two first lead wires and the other of the two second lead wires.

14. The light bulb shaped lamp according to claim 13,
wherein the stem is bonded to the globe so as to close the opening of the globe, and
a part of each of the two first lead wires and a part of each of the two second lead wires are sealed to the stem.

15. The light bulb shaped lamp according to claim 12,
wherein in the globe, the first lead wire electrically connects the first light-emitting module and the second light-emitting module.

16. The light bulb shaped lamp according to claim 1,
wherein the first base platform is translucent.

17. The light bulb shaped lamp according to claim 1,
wherein the stem is transparent to visible light.

18. The light bulb shaped lamp according to claim 1,
wherein the globe is composed of glass transparent to visible light.

19. A lighting apparatus comprising
the light bulb shaped lamp according to claim 1.

* * * * *